(12) United States Patent
Lee et al.

(10) Patent No.: US 11,605,681 B2
(45) Date of Patent: Mar. 14, 2023

(54) ELECTROLUMINESCENT DISPLAY DEVICE

(71) Applicant: LG Display Co., Ltd., Seoul (KR)

(72) Inventors: Sang-Bin Lee, Paju-si (KR); In-Sun Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 150 days.

(21) Appl. No.: 17/103,821

(22) Filed: Nov. 24, 2020

(65) Prior Publication Data

US 2021/0175304 A1 Jun. 10, 2021

(30) Foreign Application Priority Data

Dec. 6, 2019 (KR) .......................... 10-2019-0161472

(51) Int. Cl.
  *H01L 27/32* (2006.01)

(52) U.S. Cl.
  CPC ...... *H01L 27/3246* (2013.01); *H01L 27/3223* (2013.01); *H01L 27/322* (2013.01); *H01L 27/3211* (2013.01)

(58) Field of Classification Search
  CPC .................. H01L 27/3246; H01L 27/3223
  See application file for complete search history.

(56) References Cited

U.S. PATENT DOCUMENTS

2014/0183479 A1\* 7/2014 Park .................... H01L 27/3218
  438/34

FOREIGN PATENT DOCUMENTS

KR 10-2015-0042989 A 4/2015

\* cited by examiner

*Primary Examiner* — Fernando L Toledo
*Assistant Examiner* — Valerie N Newton
(74) *Attorney, Agent, or Firm* — Fenwick & West LLP

(57) ABSTRACT

An electroluminescent display device includes a substrate on which a display area displaying an image and a non-display area surrounding the display area are defined; a plurality of sub-pixels disposed in the display area on the substrate and arranged along a first direction and a second direction; a plurality of dummy sub-pixels disposed in the non-display area on the substrate; and a bank disposed in the display area and the non-display area on the substrate, wherein the bank includes a first portion corresponding to the plurality of sub-pixels and a second portion corresponding to the plurality of dummy sub-pixels, and wherein a side surface of the first portion has a reverse slope and at least a part of a side surface of the second portion has a normal slope.

18 Claims, 17 Drawing Sheets

ELECTROLUMINESCENT DISPLAY DEVICE

CROSS-REFERENCE TO RELATED APPLICATIONS

The present application claims priority from and the benefit under 35 U. S. C. § 119(a) of Republic of Korea Patent Application No. 10-2019-0161472 filed on Dec. 6, 2019, which is hereby incorporated by reference in its entirety.

BACKGROUND

Field of the Disclosure

The present disclosure relates to an electroluminescent display device, and more particularly, to an electroluminescent display device having a large size and high definition.

Discussion of the Related Art

As one of flat panel display devices, an electroluminescent display device has wide viewing angles as compared with a liquid crystal display device because it is self-luminous and also has advantages of a thin thickness, light weight and low power consumption because a backlight unit is not necessary.

In addition, the electroluminescent display device is driven by low voltages of direct current (DC) and has a fast response speed. Further, the electroluminescent display device is strong against the external impacts and is used in a wide range of temperatures because its components are solids, and particularly, the electroluminescent display device can be manufactured at low costs.

The electroluminescent display device includes a plurality of pixels, each of which has red, green and blue sub-pixels, and displays various color images by allowing the red, green and blue sub-pixels to selectively emit light.

The red, green and blue sub-pixels have red, green and blue light-emitting layers, respectively, and each light-emitting layer is formed through a vacuum thermal evaporation process in which a luminous material is selectively deposited using a fine metal mask (FMM).

However, the evaporation process increases manufacturing costs due to preparation of the mask and has a problem in application to a large-sized and high-definition display device due to manufacturing variations, sagging, shadow effect of the mask, and the like.

SUMMARY

Accordingly, the present disclosure is directed to an electroluminescent display device that substantially obviates one or more of the problems due to limitations and disadvantages of the related art.

An object of the present disclosure is to provide an electroluminescent display device having a large size and high definition.

Additional features and advantages of the present disclosure will be set forth in the description which follows, and in part will be apparent from the description, or can be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an electroluminescent display device that includes a substrate on which a display area displaying an image and a non-display area surrounding the display area are defined, a plurality of sub-pixels disposed in the display area on the substrate and arranged along a first direction and a second direction; a plurality of dummy sub-pixels disposed in the non-display area on the substrate, and a bank disposed in the display area and the non-display area on the substrate, wherein the bank includes a first portion corresponding to the plurality of sub-pixels and a second portion corresponding to the plurality of dummy sub-pixels, and wherein a side surface of the first portion has a reverse slope and at least a part of a side surface of the second portion has a normal slope.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure.

DETAILED DESCRIPTION

Reference will now be made in detail to exemplary embodiments of the disclosure, examples of which are illustrated in the accompanying drawings.

An electroluminescent display device according to an embodiment of the present disclosure includes a plurality of pixels to display an image, and each of the plurality of pixels includes red, green and blue sub-pixels. A pixel region corresponding to each sub-pixel can have a configuration shown in FIG. 1.

Figure 1:
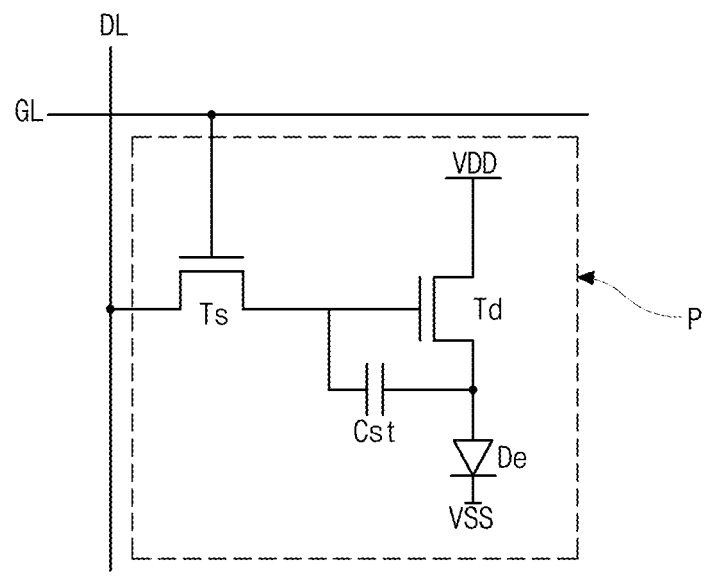
FIG. 1 is a circuit diagram of one pixel region of an electroluminescent display device according to an embodiment of the present disclosure.

FIG. 1 is a circuit diagram of one pixel region of an electroluminescent display device according to an embodiment of the present disclosure.

In FIG. 1, the electroluminescent display device according to the embodiment of the present disclosure includes a plurality of gate lines and a plurality of data lines crossing each other to define a plurality of pixel regions. Particularly, in the example of FIG. 1, a gate line GL and a data line DL cross each other to define a pixel region P. A switching thin film transistor Ts, a driving thin film transistor Td, a storage capacitor Cst, and a light-emitting diode De are formed in each pixel region P.

More specifically, a gate electrode of the switching thin film transistor Ts is connected to the gate line GL and a source electrode of the switching thin film transistor Ts is connected to the data line DL. A gate electrode of the driving thin film transistor Td is connected to a drain electrode of the switching thin film transistor Ts and a source electrode of the driving thin film transistor Td is connected to a high voltage supply VDD. An anode of the light-emitting diode De is connected to a drain electrode of the driving thin film transistor Td, and a cathode of the light-emitting diode De is connected to a low voltage supply VSS. The storage capacitor Cst is connected to the gate electrode and the drain electrode of the driving thin film transistor Td.

The electroluminescent display device is driven to display an image. For example, when the switching thin film transistor Ts is turned on by a gate signal applied through the gate line GL, a data signal from the data line DL is applied to the gate electrode of the driving thin film transistor Td and an electrode of the storage capacitor Cst through the switching thin film transistor Ts.

When the driving thin film transistor Td is turned on by the data signal, an electric current flowing through the light-emitting diode De is controlled, thereby displaying an image. The light-emitting diode De emits light due to the current supplied through the driving thin film transistor Td from the high voltage supply VDD.

Namely, the amount of the current flowing through the light-emitting diode De is proportional to the magnitude of the data signal, and the intensity of light emitted by the light-emitting diode De is proportional to the amount of the current flowing through the light-emitting diode De. Thus, the pixel regions P show different gray levels depending on the magnitude of the data signal, and as a result, the electroluminescent display device displays an image.

In addition, the storage capacitor Cst maintains charges corresponding to the data signal for a frame when the switching thin film transistor Ts is turned off. Accordingly, even if the switching thin film transistor Ts is turned off, the storage capacitor Cst allows the amount of the current flowing through the light-emitting diode De to be constant and the gray level shown by the light-emitting diode De to be maintained until a next frame.

Meanwhile, one or more thin film transistors and/or capacitors can be added in the pixel region P in addition to the switching and driving thin film transistors Ts and Td and the storage capacitor Cst.

For example, in the electroluminescent display device, the driving thin film transistor Td is turned on for a relatively long time while the data signal is applied to the gate electrode of the driving thin film transistor Td and the light-emitting diode De emits light to thereby display the gray level. The driving thin film transistor Td can deteriorate due to application of the data signal for a long time. Therefore, the mobility and/or threshold voltage Vth of the driving thin film transistor Td are changed, and thus the pixel region P of the electroluminescent display device displays a different gray level with respect to the same data signal. This causes non-uniform luminance, thereby lowering the image quality of the electroluminescent display device.

Accordingly, to compensate the change of the mobility and/or threshold voltage of the driving thin film transistor Td, at least one sensing thin film transistor and/or capacitor for sensing a voltage change can be further added in the pixel region P. The sensing thin film transistor and/or capacitor can be connected to a reference line for applying a reference voltage and outputting a sensing voltage.

Figure 2:
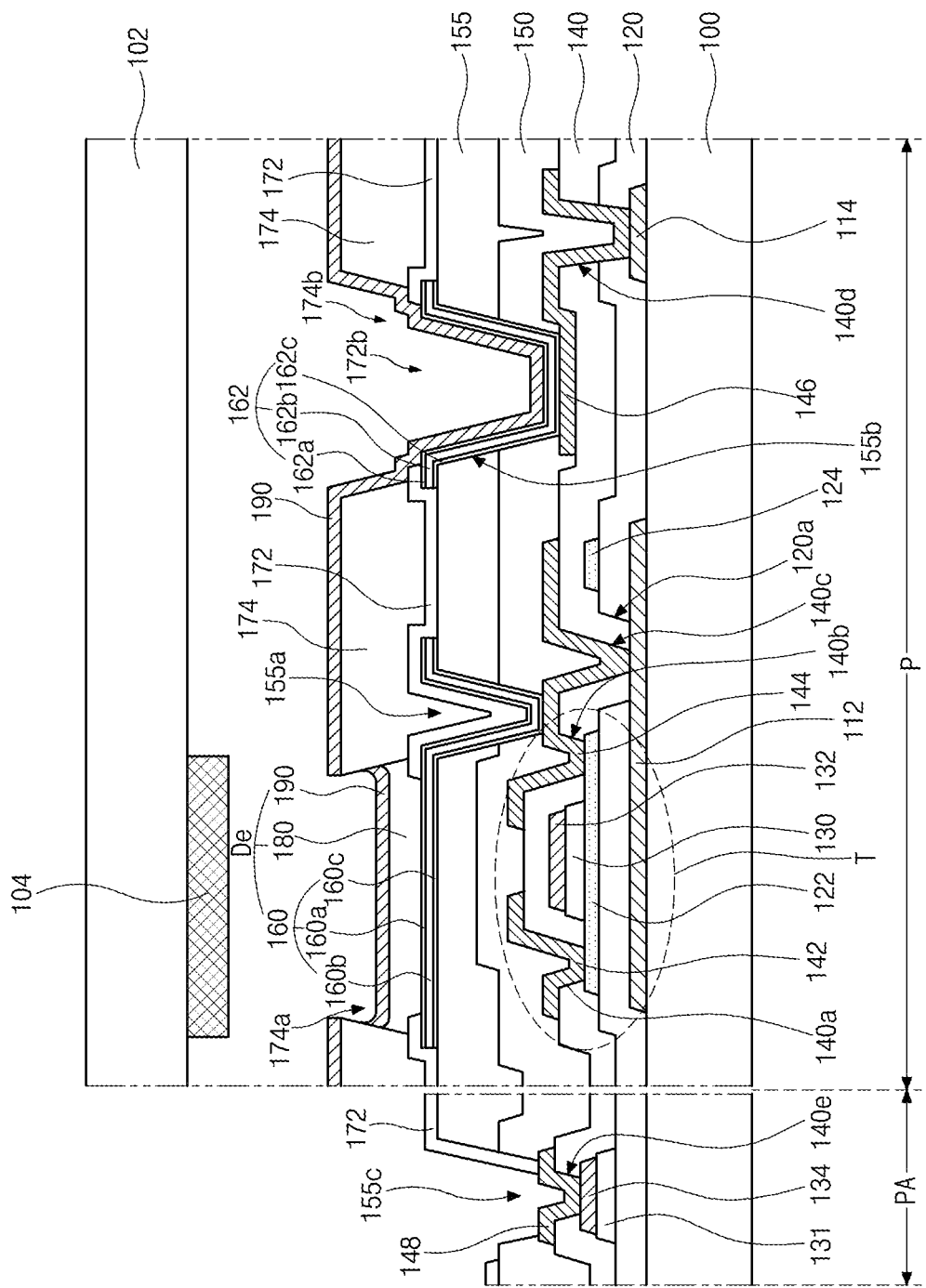
FIG. 2 is a schematic cross-sectional view of an electroluminescent display device according to the embodiment of the present disclosure.

FIG. 2 is a schematic cross-sectional view of an electroluminescent display device according to the embodiment of the present disclosure and shows a pixel region P and a pad region PA. The pixel region P is disposed in a display area displaying an image, and the pad region PA is disposed in a non-display area surrounding the display area.

In FIG. 2, a light-blocking pattern 112 and a first auxiliary electrode 114 of a first conductive material such as metal are formed in the pixel region P on a substrate 100. The substrate 100 can be a glass substrate or a plastic substrate. For example, polyimide can be used for the plastic substrate, but is not limited thereto.

The light-blocking pattern 112 and the first auxiliary electrode 114 can be formed of at least one of aluminum (Al), copper (Cu), molybdenum (Mo), titanium (Ti), chromium (Cr), nickel (Ni), tungsten (W) and an alloy thereof and can have a single-layered structure or a multi-layered structure. For example, the light-blocking pattern 112 and the first auxiliary electrode 114 can have a double-layered structure including a lower layer of a molybdenum-titanium alloy (MoTi) and an upper layer of copper (Cu), and the upper layer can have a thicker thickness than the lower layer.

A buffer layer 120 is formed on the light-blocking pattern 112 and the first auxiliary electrode 114 substantially on an entire surface of the substrate 100. The buffer layer 120 can be formed of an inorganic insulating material such as silicon oxide ($SiO_2$) or silicon nitride (SiNx) and can be formed as a single layer or multi layers.

Here, the buffer layer 120 has a buffer hole 120a on the light-blocking pattern 112, and a top surface of the light-blocking pattern 112 is partially exposed through the buffer hole 120a.

A semiconductor layer 122 and a capacitor electrode 124 are patterned and formed on the buffer layer 120. The semiconductor layer 122 and the capacitor electrode 124 are spaced apart from each other over the light-blocking pattern 112. The light-blocking pattern 112 blocks light incident on the semiconductor layer 122 and prevents the semiconductor layer 122 from deteriorating due to the light.

The semiconductor layer 122 and the capacitor electrode 124 can be formed of polycrystalline silicon, and in this case, both ends of the semiconductor layer 122 and the capacitor electrode 124 can be doped with impurities. Alternatively, the semiconductor layer 122 and the capacitor electrode 124 can be formed of an oxide semiconductor material.

A gate insulation layer 130 of an insulating material and a gate electrode 132 of a second conductive material such as metal are sequentially formed on the semiconductor layer 122. The gate insulation layer 130 and the gate electrode 132 are disposed to correspond to a center of the semiconductor layer 122.

The gate insulation layer 130 can be formed of an inorganic insulating material such as silicon oxide ($SiO_2$) or silicon nitride (SiNx). When the semiconductor layer 122 is made of an oxide semiconductor material, it is preferable that the gate insulation layer 130 is formed of silicon oxide ($SiO_2$).

Alternatively, when the semiconductor layer 122 is made of polycrystalline silicon, the gate insulation layer 130 can be formed of silicon oxide ($SiO_2$) or silicon nitride (SiNx).

The gate electrode 132 can be formed of at least one of aluminum (Al), copper (Cu), molybdenum (Mo), titanium (Ti), chromium (Cr), nickel (Ni), tungsten (W) and an alloy thereof and can have a single-layered structure or a multi-layered structure. For example, the gate electrode 132 can have a double-layered structure including a lower layer of a molybdenum-titanium alloy (MoTi) and an upper layer of copper (Cu), and the upper layer can have a thicker thickness than the lower layer.

As shown in the figure, the gate insulation layer 130 can be patterned to have the same shape as the gate electrode 132. At this time, a width of the gate insulation layer 130 can be wider than a width of the gate electrode 132, and thus, edges of a top surface of the gate insulation layer 130 can be exposed. Alternatively, the width of the gate insulation layer 130 can be the same as the width of the gate electrode 132.

Or, the gate insulation layer 130 may not be patterned and can be formed substantially over the entire surface of the substrate 100.

Meanwhile, a gate line (not shown) can be further formed of the same material and on the same layer as the gate electrode 132.

In addition, a gate insulation pattern 131 and a first pad electrode 134 are sequentially formed on the buffer layer 120 in the pad region PA. The gate insulation pattern 131 can be formed of the same material as the gate insulation layer 130, and the first pad electrode 134 can be formed of the same material as the gate electrode 132. The gate insulation pattern 131 can be patterned to have the same shape as the first pad electrode 134. At this time, a width of the gate insulation pattern 131 can be larger than a width of the first pad electrode 134, and edges of a top surface of the gate insulation pattern 131 can be exposed. Alternatively, the width of the gate insulation pattern 131 can be the same as the width of the first pad electrode 134.

An interlayer insulation layer 140 made of an insulating material is formed on the gate electrode 132 substantially over the entire surface of the substrate 100. The interlayer insulation layer 140 can be formed of an inorganic insulating material such as silicon oxide ($SiO_2$) or silicon nitride (SiNx). Alternatively, the interlayer insulation layer 140 can be formed of an organic insulating material such as photo acryl or benzocyclobutene.

The interlayer insulation layer 140 has first, second, third and fourth contact holes 140a, 140b, 140c and 140d. The first and second contact holes 140a and 140b expose the both ends of the semiconductor layer 122. The third contact hole 140c partially exposes the top surface of the light-blocking pattern 112 and is located in the buffer hole 120a. Alternatively, the buffer hole 120a may be omitted, and the third contact hole 140c can be formed in the buffer layer 120 as well as in the interlayer insulation layer 140 to partially expose the top surface of the light-blocking pattern 112. The fourth contact hole 140d is formed in the buffer layer 120 as well as in the interlayer insulation layer 140 to partially expose a top surface of the first auxiliary electrode 114.

The interlayer insulation layer 140 is also formed on the first pad electrode 134 in the pad region PA and has a fifth contact hole 140e partially exposing a top surface of the first pad electrode 134.

Source and drain electrodes 142 and 144 and a second auxiliary electrode 146 made of a third conductive material such as metal are formed on the interlayer insulation layer 140. The source and drain electrodes 142 and 144 and the second auxiliary electrode 146 can be formed of at least one of aluminum (Al), copper (Cu), molybdenum (Mo), titanium (Ti), chromium (Cr), nickel (Ni), tungsten (W) and an alloy thereof and can have a single-layered structure or a multi-layered structure. For example, the source and drain electrodes 142 and 144 and the second auxiliary electrode 146 can have a double-layered structure including a lower layer of a molybdenum-titanium alloy (MoTi) and an upper layer of copper (Cu), and the upper layer can have a thicker thickness than the lower layer. Alternatively, the source and drain electrodes 142 and 144 and the second auxiliary electrode 146 can have a triple-layered structure.

The source and drain electrodes 142 and 144 are spaced apart from each other with the gate electrode 132 positioned therebetween. The source and drain electrodes 142 and 144 contact the both ends of the semiconductor layer 122 through the first and second contact holes 140a and 140b, respectively. Further, the drain electrode 144 contacts the light-blocking pattern 112 through the third contact hole 140c and overlaps the capacitor electrode 124. The capacitor electrode 124 overlaps the light-blocking pattern 112 and the drain electrode 144 to form a storage capacitor.

Meanwhile, the second auxiliary electrode 146 contacts the first auxiliary electrode 114 through the fourth contact hole 140d.

In addition, a data line (not shown) and a high voltage supply line (not shown) can be further formed on the interlayer insulation layer 140 and can be made of the third conductive material.

The semiconductor layer 122, the gate electrode 132, and the source and drain electrodes 142 and 144 form a thin film transistor T. The thin film transistor T has a coplanar structure in which the gate electrode 132 and the source and drain electrodes 142 and 144 are located at the same side with respect to the semiconductor layer 122.

Alternatively, the thin film transistor T can have an inverted staggered structure in which the gate electrode and the source and drain electrodes are located at different sides with respect to the semiconductor layer. That is, the gate electrode can be disposed under the semiconductor layer, and the source and drain electrodes can be disposed over the semiconductor layer. In this case, the semiconductor layer can be formed of oxide semiconductor or amorphous silicon.

The thin film transistor T corresponds to a driving thin film transistor Td of FIG. 1, and a switching thin film transistor Ts of FIG. 1 having the same structure as the driving thin film transistor Td can be further formed on the substrate 100. The gate electrode 132 of the driving thin film transistor can be connected to a drain electrode of the switching thin film transistor, and the source electrode 142 of the driving thin film transistor is connected to the high voltage supply line. In addition, a gate electrode and a source electrode of the switching thin film transistor can be connected to the gate line and the data line, respectively.

In addition, a second pad electrode 148 is formed on the interlayer insulation layer 140 in the pad region PA. The second pad electrode 148 is formed of the same material as the source and drain electrodes 142 and 144 and is in contact with the first pad electrode 134 through the fifth contact hole 140e.

A passivation layer 150 of an insulating material is formed on the source and drain electrodes 142 and 144 and the second auxiliary electrode 146 substantially over the entire surface of the substrate 100. The passivation layer 150 can be formed of an inorganic insulating material such as silicon oxide ($SiO_2$) or silicon nitride (SiNx).

Next, an overcoat layer 155 of an insulating material is formed on the passivation layer 150 substantially over the entire surface of the substrate 100. The overcoat layer 155 can be formed of an organic insulating material such as photo acryl or benzocyclobutene. The overcoat layer 155 can eliminate level differences due to lower layers and have a substantially flat top surface.

Here, one of the passivation layer 150 and the overcoat layer 155 can be omitted. For example, the passivation layer 150 can be omitted, but is not limited thereto.

The passivation layer 150 and the overcoat layer 155 have a drain contact hole 155a exposing the drain electrode 144. Further, the passivation layer 150 and the overcoat layer 155 have a sixth contact hole 155b exposing the second auxiliary electrode 146.

Meanwhile, the passivation layer 150 and the overcoat layer 155 are also formed in the pad region PA. The passivation layer 150 and the overcoat layer 155 of the pad region PA have a pad hole 155c exposing the second pad electrode 148. At this time, the overcoat layer 155 of the pad region PA can be partially removed, thereby exposing the passivation layer 150 thereunder. Accordingly, the level difference between the layers formed on the second pad electrode 148 is lowered, and it is possible to facilitate contact with external circuit.

A first electrode 160 is formed on the overcoat layer 155 in the pixel region P and formed of a conductive material. The first electrode 160 is in contact with the drain electrode 144 through the drain contact hole 155a.

The first electrode 160 includes a first layer 160a and a second layer 160b, and the second layer 160b is disposed between the first layer 160a and the substrate 100, more particularly, between the first layer 160a and the overcoat layer 155.

The first layer 160a is formed of a conductive material having relatively high work function. For example, the first layer 160a can be formed of a transparent conductive material such as indium tin oxide (ITO) or indium zinc oxide (IZO). The second layer 160b is formed of a metal material having relatively high reflectance. For example, the second layer 160b can be formed of silver (Ag), aluminum (Al) or aluminum-palladium-copper (APC) alloy. Here, the work function of the first layer 160a is higher than the work function of the second layer 160b.

A thickness of the second layer 160b can be larger than a thickness of the first layer 160a. For example, the thickness of the second layer 160b can be 80 nm to 100 nm, and the thickness of the first layer 160a can be 10 nm to 80 nm. However, the present disclosure is not limited thereto.

In addition, the first electrode 160 can further include a third layer 160c between the second layer 160b and the overcoat layer 155. The third layer 160c is formed to improve the adhesion property between the second layer 160b and the overcoat layer 155 and can be omitted. For example, the third layer 160c can be formed of a transparent conductive material such as ITO or IZO, but is not limited thereto.

A thickness of the third layer 160c can be smaller than the thickness of the second layer 160b and can be smaller than or equal to the thickness of the first layer 160a. For example, the thickness of the third layer 160c can be 10 nm, but is not limited thereto.

In addition, a connection pattern 162 is formed on the overcoat layer 155 and is formed of the same material as the first electrode 160. Accordingly, the connection pattern 162 can include first, second and third layers 162a, 162b and 162c. At this time, the second layer 162b is disposed between the first layer 162a and the third layer 162c, and the third layer 162c is disposed between the second layer 162b and the substrate 100, more particularly, between the second layer 162b and the overcoat layer 155. The connection pattern 162 is in contact with the second auxiliary electrode 146 through the sixth contact hole 155b.

As described above, when the third layer 160c of the first electrode 160 is omitted and the first electrode 160 is configured as double layers, the third layer 162c of the connection pattern 162 is also omitted.

A bank of an insulating material is formed on the first electrode 160. The bank includes a first bank 172 of a hydrophilic property and a second bank 174 of a hydrophobic property.

More particularly, the first bank 172 overlaps and covers edges of the first electrode 160 and exposes a central portion of the first electrode 160. In addition, the first bank 172 is also formed on the connection pattern 162 and overlaps and covers edges of the connection pattern 162. The first bank 172 has a first auxiliary contact hole 172b exposing a central portion of the connection pattern 162.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

Meanwhile, the first bank 172 can also be formed in the pad region PA. The first bank 172 is removed to correspond to the pad hole 155c, thereby exposing the second pad electrode 148.

The second bank 174 is formed on the first bank 172. At this time, at least a top surface of the second bank 174 is hydrophobic, and a side surface of the second bank 174 can be hydrophobic or hydrophilic.

The second bank 174 has an opening 174a exposing the central portion of the first electrode 160. The opening 174a of the second bank 174 can be formed to correspond to the same color sub-pixel column, and this will be described in detail later. Here, at least one side surface of the second bank 174 corresponding to the opening 174a has a reverse slope. That is, a width of the opening 174a decreases as a distance from the first substrate 100 increases. At this time, a top width of the second bank 174 can be wider than a bottom width of the second bank 174.

The second bank 174 is disposed on the first bank 172 with a narrower width than the first bank 172 and exposes edges of the first bank 172. That is, the bottom width of the second bank 174 is narrower than a top width of the first bank 172. In addition, a thickness of the second bank 174 can be larger than a thickness of the first bank 172.

The second bank 174 can be formed of an organic insulating material having a hydrophobic property. Alternatively, the second bank 174 can be formed of an organic insulating material having a hydrophilic property and subjected to a hydrophobic treatment.

Further, the second bank 174 has a second auxiliary contact hole 174b corresponding to the first auxiliary contact hole 172b. The connection pattern 162 is exposed through the first and second auxiliary contact holes 172b and 174b.

The connection pattern 162 and the first and second auxiliary contact holes 172b and 174b can be omitted in some pixel regions.

As shown in the figure, the drain contact hole 155a can be formed under the first and second banks 172 and 174. However, the location of the drain contact hole 155a is not limited thereto and can be changed.

Meanwhile, only the first bank 172 can be disposed on other edges of the first electrode 160 not shown in the figure.

In addition, the first bank 172 and the second bank 174 may be formed of different materials and separated from each other in FIG. 2. Alternatively, the hydrophilic first bank 172 and the hydrophobic second bank 174 can be formed of the same material and formed as one body. For example, an organic material layer can be formed substantially over the entire surface of the substrate 100, can be exposed to light through a halftone mask including a light-transmitting portion, a light-blocking portion and a half light-transmitting portion, and can be patterned, thereby forming the hydrophilic first bank 172 and the hydrophobic second bank 174.

A light-emitting layer 180 is formed on the first electrode 160 exposed by the opening 174a. The light-emitting layer 180 can include a first charge auxiliary layer, a light-emitting material layer, and a second charge auxiliary layer that are sequentially positioned over the first electrode 160. The light-emitting material layer can be formed of any one of red, green and blue luminescent materials, but is not limited thereto. The luminescent material can be an organic luminescent material such as a phosphorescent compound or a fluorescent compound or can be an inorganic luminescent material such as a quantum dot.

The first charge auxiliary layer can be a hole auxiliary layer, and the hole auxiliary layer can include at least one of a hole injecting layer (HIL) and a hole transporting layer (HTL). In addition, the second charge auxiliary layer can be an electron auxiliary layer, and the electron auxiliary layer can include at least one of an electron injecting layer (EIL) and an electron transporting layer (ETL). However, the present disclosure is not limited thereto.

Here, the light-emitting layer 180 is formed through a solution process. Thus, the process can be simplified and a display device with a large size and high resolution can be provided. A spin coating method, an ink jet printing method, or a screen printing method can be used as the solution process, but the present disclosure is not limited thereto. When the solution is dried, a drying speed of a solvent in a region adjacent to the second bank 174 is different from that in other regions. That is, the drying speed of the solvent in the region adjacent to the second bank 174 is faster than that in the other regions. Therefore, a height of the light-emitting layer 180 in the region adjacent to the second bank 174 can rise as it gets closer to the second bank 174. By the way, in the present disclosure, the at least one side surface of the second bank 174 corresponding to the opening 174a has the reverse slope, and the height of the light-emitting layer 180 at the side surface of the second bank 174 having the reverse slope is lower than the height of the light-emitting layer 180 at a side surface of the second bank 174 having a normal slope. Accordingly, the thickness of the light-emitting layer 180 can be more uniform.

On the other hand, the second charge auxiliary layer of the light-emitting layer 180 can be formed through a thermal evaporation process. Accordingly, the second charge auxiliary layer can be formed substantially over the entire surface of the substrate 100. That is, the second charge auxiliary layer can be formed on the top surface and the at least one side surface of the second bank 174 and can also be formed on the connection pattern 162.

A second electrode 190 of a conductive material having a relatively low work function is formed on the light-emitting layer 180, the second bank 174 and the connection pattern 162 substantially over the entire surface of the substrate 100. The second electrode 190 can be formed on the top surface and at least one side surface of the second bank 174.

Since the at least one side surface of the second bank 174 corresponding to the opening 174a has the reverse slope, the second electrode 190 on the light-emitting layer 180 is disconnected from the second electrode 190 on the second bank 174 due to the side surface of the second bank 174 having the reverse slope.

The second electrode 190 can be formed of aluminum (Al), magnesium (Mg), silver (Ag), or an alloy thereof. At this time, the second electrode 190 has a relatively thin thickness such that light from the light-emitting layer 180 can be transmitted therethrough. For example, the second electrode 190 can have the thickness of 5 nm to 10 nm.

Alternatively, the second electrode 190 can be formed of a transparent conductive material such as indium-gallium-oxide (IGO) or IZO, but is not limited thereto.

The second electrode 190 can be in contact with and electrically connected to the connection pattern 162 through the first and second auxiliary contact holes 172b and 174b.

The first electrode 160, the light-emitting layer 180, and the second electrode 190 constitute a light-emitting diode De. The first electrode 160 can serve as an anode, and the second electrode 190 can serve as a cathode, but is not limited thereto.

The electroluminescent display device according to the embodiment of the present disclosure can be a top emission type in which light from the light-emitting layer 180 of the light-emitting diode De is output toward a direction opposite the substrate 100, that is, output to the outside through the second electrode 190. The top emission type display device can have a wider emission area than a bottom emission type display device of the same size, to thereby improve luminance and reduce power consumption.

At this time, the light-emitting diode De of each pixel region P can have an element thickness for a micro-cavity effect corresponding to a wavelength of the emitted light, thereby increasing the light efficiency.

In the meantime, although not shown in the figure, a capping layer can be formed on the second electrode 190 substantially over the entire surface of the substrate 100. The capping layer can be formed of an insulating material having a relatively high refractive index. The wavelength of light traveling along the capping layer can be amplified by surface plasma resonance, and thus the intensity of the peak can be increased, thereby improving the light efficiency in the top emission type electroluminescent display device. For example, the capping layer can be formed as a single layer of an organic layer or an inorganic layer or formed as organic/inorganic stacked layers.

Next, a second substrate 102 is disposed over and spaced apart from the first substrate 100. The second substrate 102 can be a glass substrate or a plastic substrate. For example, polyimide can be used for the plastic substrate, but is not limited thereto.

A color filter 104 is formed on an inner surface of the second substrate 102 facing the first substrate 100. The color filter 104 is spaced apart from the light-emitting layer 180 and overlaps the light-emitting layer 180. The color filter 104 can be one of red, green and blue color filters and can be omitted.

A filling member can be formed in a space between the first substrate 100 and the second substrate 102. The filling member can be in contact with the second electrode 190 and the color filter 104. For example, the filling member can be formed of epoxy, but is not limited thereto.

As described above, in the electroluminescent display device according to the embodiment of the present disclosure, by forming the light-emitting layer 180 through the solution process, a fine metal mask is omitted to thereby reduce the manufacturing costs, and a display device with a large size and high definition can be implemented.

Also, when the light-emitting layer 180 is formed through the solution process, the solution is dropped in each of a plurality of sub-pixels at a time, and to do this, different nozzles are used for respective sub-pixels. However, a variation in the thickness of a thin film formed in each sub-pixel occurs due to a deviation in the dropping amounts of the nozzles. Accordingly, in the present disclosure, the light-emitting layers 180 of the same color sub-pixels are connected to each other to thereby form one body. Thus, the deviation in the dropping amounts of the nozzles is reduced or minimized, and thicknesses of the light-emitting layers 180 formed in the respective sub-pixels can be uniform.

Meanwhile, in solution process, the dropped solution is dried to form the light-emitting layer 180. At this time, the saturation of the solution is relatively high in the center of the display device because the solution is uniformly located in all the surrounding areas. On the other hand, the saturation of the solution is relatively low in the periphery of the display device because the solution is located in some of the surrounding areas, and the solvent is faster evaporated in the periphery of the display device than in the center of the display device. Thus, in the periphery of the display device, the pile-up phenomenon occurs severely, and the height of the light-emitting layer 180 becomes high. Accordingly, the thickness of the light-emitting layer 180 in the periphery of the display device is thicker than the thickness of the light-emitting layer 180 in the center of the display device, and this causes the luminance difference between the center and the periphery of the display device. The luminance efficiency can be lowered due to the luminance difference according to the locations. To solve the problem, in the present disclosure, a dummy sub-pixel is formed in the non-display area.

Additionally, in the present disclosure, the side surface of the second bank 174 has the reverse slope in the display area, thereby alleviating the pile-up phenomenon at the side surface of the second bank 174. Thus, the thickness of the light-emitting layer 180 can be further uniform.

Here, the second electrode 190 of the present disclosure is formed to have a relatively thin film in order to transmit light, and the second electrode 190 is disconnected due to the side surface of the second bank 174 having the reverse slope, thereby increasing the resistance of the second electrode 190. This causes the concentration of the currents when the light-emitting diode De is driven, and a burning phenomenon occurs due to heat, thereby decreasing the lifetime of the light-emitting diode De.

Accordingly, in the present disclosure, at least one side surface of the second bank 174 in the non-display area is configured to have a normal slope. The resistance of the second electrode 190 is prevented from increasing, and the concentration of the current is alleviated.

First Embodiment

Figure 3:
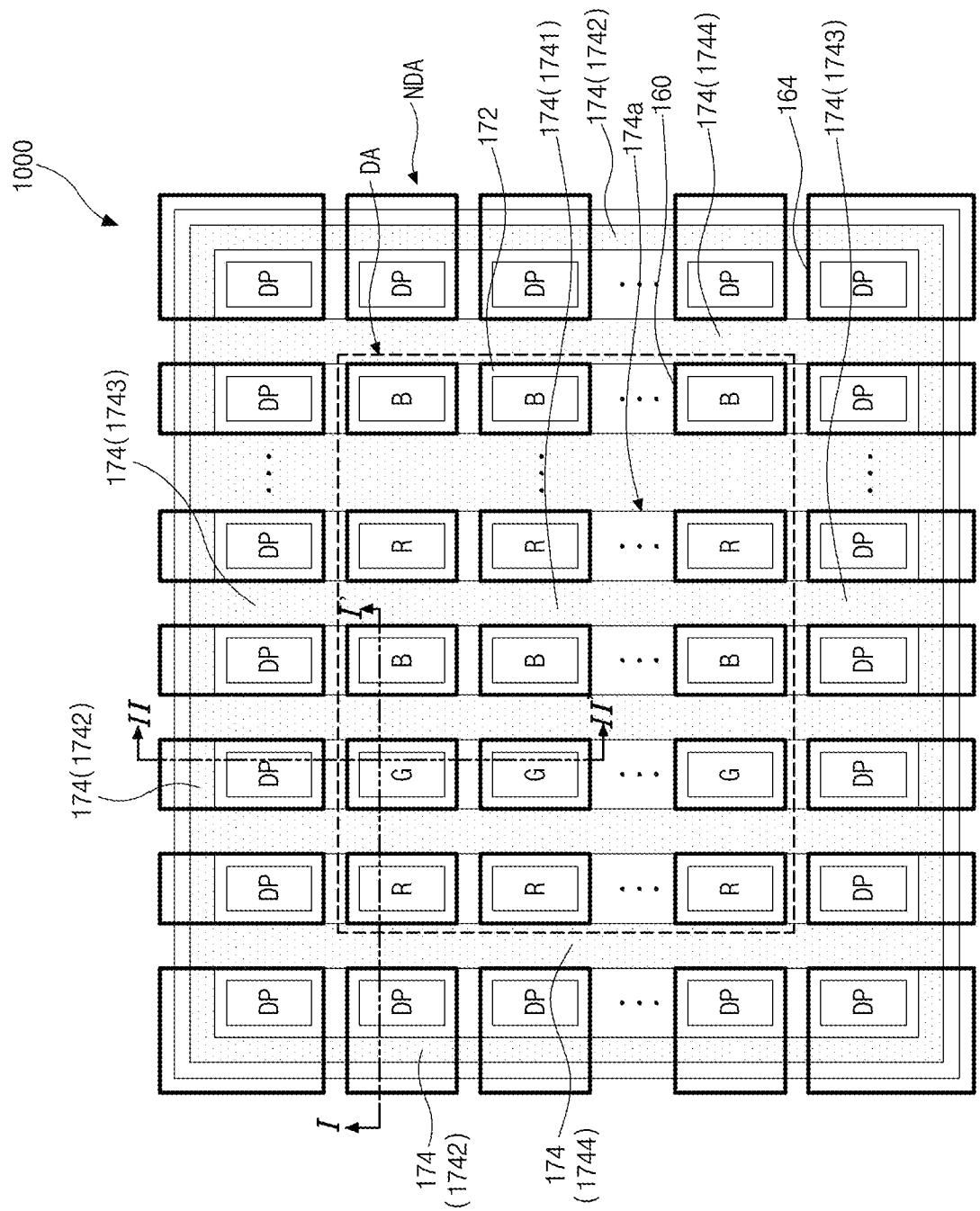
FIG. 3 is a schematic plan view of an electroluminescent display device according to a first embodiment of the present disclosure.

FIG. 3 is a schematic plan view of an electroluminescent display device according to a first embodiment of the present disclosure and mainly shows a bank configuration.

In FIG. 3, the electroluminescent display device 1000 according to the first embodiment of the present disclosure includes a display area DA displaying an image and a non-display area NDA surrounding the display area DA.

In the display area DA, red, green and blue sub-pixels R, G and B are disposed. The red, green and blue sub-pixels R, G and B are sequentially arranged along a first direction, and the same color sub-pixels R, G and B are arranged along a second direction. For example, R, G and B sub-pixels are repeatedly arranged in that order along the first direction (e.g., horizontal direction), whereas a column of R sub-pixels, a column of G sub-pixels, and a column of B sub-pixels are repeatedly arranged in that order along the second direction (e.g., vertical direction). Here, the red, green and blue sub-pixels R, G and B are shown to each have a rectangular shape, but is not limited thereto. The red, green and blue sub-pixels R, G and B each can have various shapes such as a rectangular shape with rounded corners, an oval shape, or the like.

A plurality of dummy sub-pixels DP are disposed in the non-display area NDA. One dummy sub-pixel DP is illustrated as being disposed at each of left and right sides of each sub-pixel row along the first direction of the display area DA and upper and lower sides of each sub-pixel column along the second direction of the display area DA, but the number of the dummy sub-pixels DP is not limited thereto. For example, two or more dummy sub-pixels DP can be disposed at each of the upper and lower sides of each sub-pixel column, and two or more dummy sub-pixels DP can be disposed at each of the left and right sides of each sub-pixel row.

A first electrode 160 is disposed at each of the red, green and blue sub-pixels R, G and B of the display area DA, and a dummy electrode 164 is disposed at each of the dummy sub-pixels DP of the non-display area NDA. The first electrode 160 and the dummy electrode 164 are formed of the same material and on the same layer.

A bank is disposed to correspond to the sub-pixels R, G and B of the display area DA and the dummy sub-pixels DP of the non-display area NDA. The bank includes a first bank 172 of a hydrophilic property and a second bank 174 of a hydrophobic property.

More specifically, the first bank 172 is disposed between adjacent same color sub-pixels R, G and B and between adjacent different color sub-pixels R, G and B in the display area DA. In addition, the first bank 172 is disposed between adjacent dummy sub-pixels DP along the first and second directions in the non-display area NDA and surrounds outer edges of the non-display area NDA.

Next, the second bank 174 is disposed on the first bank 172. The second bank 174 has an opening 174*a* corresponding to each of a same color sub-pixel column along the second direction in the display area DA and a dummy sub-pixel column along the second direction in the non-display area NDA. The second bank 174 is disposed between adjacent different color sub-pixels R, G and B along the first direction in the display area DA and is disposed between the sub-pixel R or B and the dummy sub-pixel DP adjacent along the first direction in the non-display area NDA. At this time, the opening 174a corresponding to the same color sub-pixel column of the second direction can extend into the dummy sub-pixel DP of the non-display area NDA adjacent thereto along the second direction.

Accordingly, the opening 174a extends in the second direction, and the opening 174a has a length of the second direction greater than a length of the first direction, i.e., a width. In other words, the opening 174a has a short side parallel to the first direction and a long side parallel to the second direction. At this time, the second bank 174 can have a narrower width than the first bank 172 between adjacent different color sub-pixels R, G and B.

The second bank 174 includes first, second, third and fourth portions 1741, 1742, 1743 and 1744. The first portion 1741 is disposed in the display area DA, the second and third portions 1742 and 1743 are disposed in the non-display area NDA, and the fourth portion 1744 is disposed in a boundary between the display area DA and the non-display area NDA adjacent along the first direction.

More particularly, the first portion 1741 is disposed between the adjacent sub-pixels R, G and B along the first direction, and the second portion 1742 is disposed to surround the outer edge of the non-display area NDA. The third portion 1743 is disposed between the adjacent dummy sub-pixels DP along the first direction, and the fourth portion 1744 is disposed between the sub-pixel R or B and the dummy sub-pixel DP adjacent along the first direction. Here, the third portion 1743 is disposed between the first portion 1741 and the second portion 1742 along the second direction and is connected to the first portion 1741 and the second portion 1742. In addition, the third portion 1743 is disposed between the second portion 1742 and the fourth portion 1744 along the second direction and is connected to the second portion 1742 and the fourth portion 1744.

The second portion 1742 of the second bank 174 partially overlaps the dummy electrode 164, and the third and fourth portions 1743 and 1744 of the second bank 174 do not overlap the dummy electrode 164.

A cross-sectional structure of the electroluminescent display device 1000 according to the first embodiment of the present disclosure will be described in detail with reference to FIG. 4 and FIG. 5.

Figure 4:
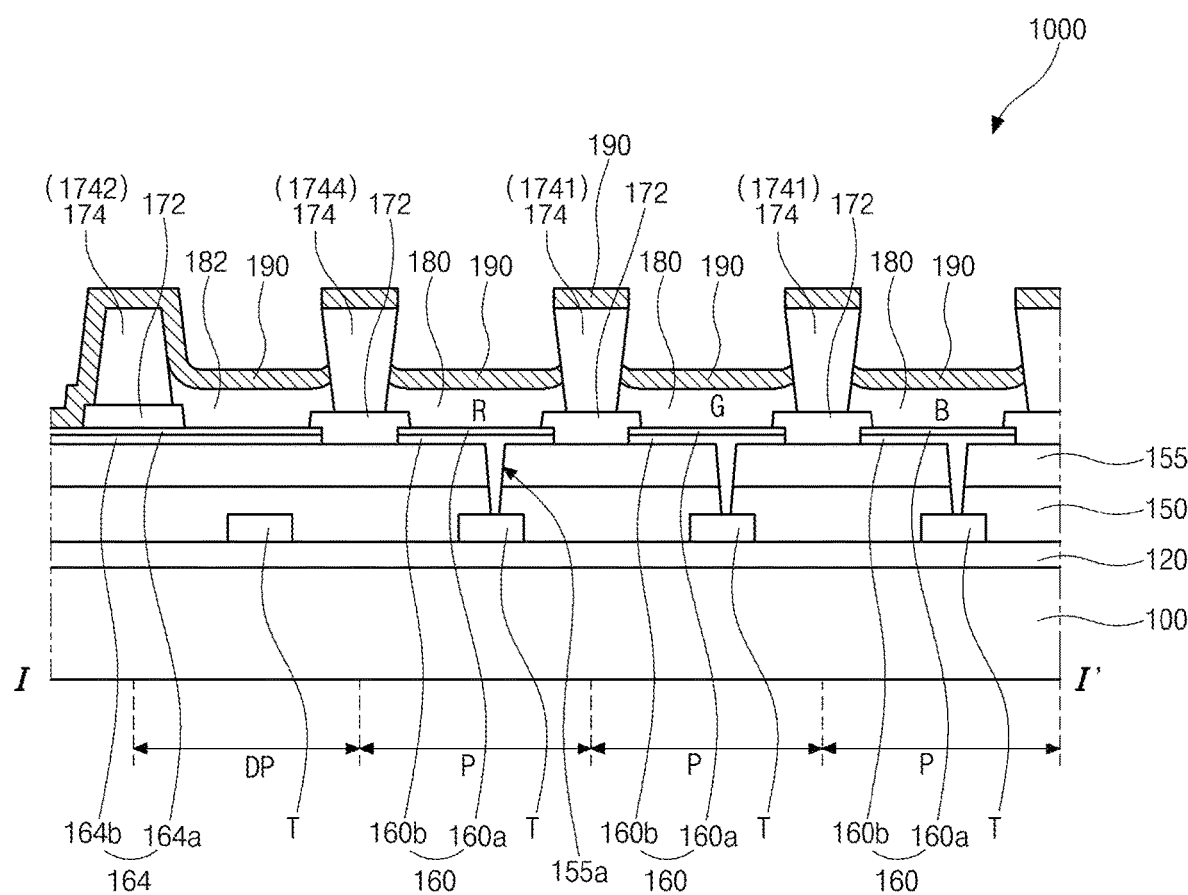
FIG. 4 is a cross-sectional view corresponding to the line I-I' of FIG. 3 according to an embodiment of the present disclosure.
Figure 5:
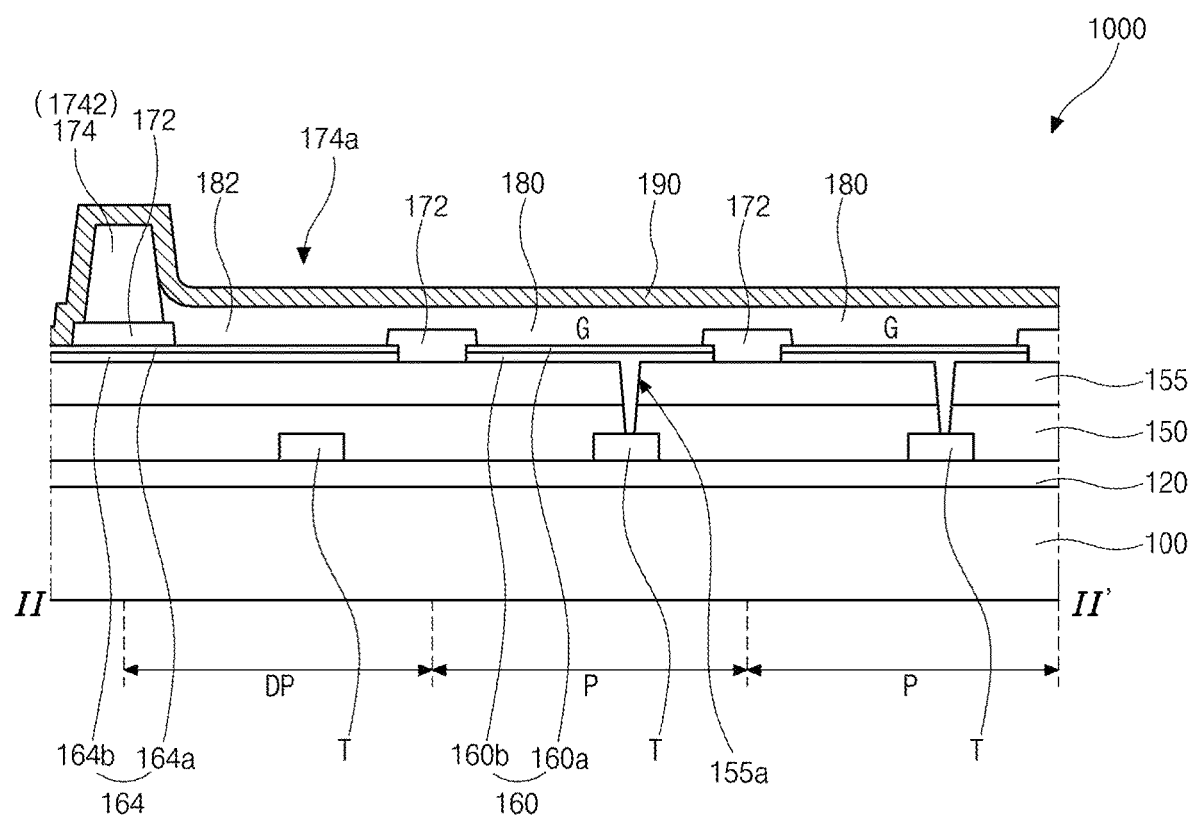
FIG. 5 is a cross-sectional view corresponding to the line II-II' of FIG. 3 according to an embodiment of the present disclosure.

FIG. 4 is a cross-sectional view corresponding to the line I-I' of FIG. 3, and FIG. 5 is a cross-sectional view corresponding to the line II-II' of FIG. 3 according to an embodiment of the present disclosure.

As shown in FIG. 4 and FIG. 5, a plurality of pixel regions P respectively corresponding to red, green and blue sub-pixels R, G and B and a dummy sub-pixel region DP corresponding to the dummy sub-pixel are defined on a substrate 100, and a buffer layer 120, thin film transistors T, a passivation layer 150 and an overcoat layer 155 are sequentially formed on the substrate 100.

Here, each thin film transistor T can have the configuration shown in FIG. 2, but is not limited thereto. In addition, although not shown in the figure, a gate insulation layer and/or an interlayer insulation layer can be further formed between the buffer layer 120 and the passivation layer 150.

In each pixel region P, the overcoat layer 155 has a drain contact hole 155a exposing a part of the thin film transistor T, that is, a drain electrode together with the passivation layer 150.

A first electrode 160 is formed in each pixel region P on the overcoat layer 155, and a dummy electrode 164 is formed in the dummy sub-pixel region DP on the overcoat layer 155. The first electrode 160 contacts the drain electrode of the thin film transistor T through the drain contact hole 155a.

On the other hand, the passivation layer 150 and the overcoat layer 155 do not have a drain contact hole in the dummy sub-pixel region DP, and the dummy electrode 164 is not connected to the thin film transistor T in the dummy sub-pixel region DP.

Meanwhile, the dummy electrode 164 and the thin film transistor T in the dummy sub-pixel region DP are formed such that a top surface in the dummy sub-pixel region DP may be substantially flush with that in the pixel region P. The thin film transistor T can be omitted in the dummy sub-pixel region DP.

In addition, although not shown in the figures, a first auxiliary electrode 114 of FIG. 2 and a second auxiliary electrode 146 of FIG. 2 connected to each other can be formed in each pixel region P, and a connection pattern 162 of FIG. 2 can be further formed in at least one pixel region P to be connected to the second auxiliary electrode 146 of FIG. 2. Alternatively, in each dummy sub-pixel region DP, the first auxiliary electrode 114 of FIG. 2 and the second auxiliary electrode 146 of FIG. 2 can be formed, and the connection pattern 162 of FIG. 2 may not be formed.

Each of the first electrode 160 and the dummy electrode 164 includes a first layer 160a and 164a and a second layer 160b and 164b, and the second layer 160b and 164b is disposed between the first layer 160a and 164a and the substrate 100, more particularly, between the first layer 160a and 164a and the overcoat layer 155.

The first layer 160a and 164a is formed of a conductive material having relatively high work function, and the second layer 160b and 164b is formed of a metal material having relatively high reflectance. The second layer 160b and 164b serves as a reflective layer.

A first bank 172 of a hydrophilic property is formed on the first electrode 160 and the dummy electrode 164. The first bank 172 overlaps and covers edges of the first electrode 160 of the pixel region P. The first bank 172 is formed between adjacent same color sub-pixels R, G and B and between adjacent different color sub-pixels R, G and B.

The first bank 172 overlaps and covers edges of the dummy electrode 164 of the dummy sub-pixel region DP. At this time, both ends of the first bank 172 are disposed on a top surface of the dummy electrode 164. In addition, the first bank 172 can overlap and cover an edge of the dummy electrode 164 adjacent to the pixel region P.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

A second bank 174 of a hydrophobic property is formed on the first bank 172. The second bank 174 has a thicker thickness than the first bank 172 and a narrower width than the first bank 172.

The second bank 174 has an opening 174a corresponding to a same color sub-pixel column and exposes the first electrodes 160 of the same color sub-pixel column and the first bank 172 between adjacent first electrodes 160 through the opening 174a. In addition, the opening 174a extends into the dummy sub-pixel DP adjacent to the same color sub-pixel column, and the dummy electrode 164 is exposed through the opening 174a.

The second bank 174 includes first, second, third, and fourth portions 1741, 1742, 1743 and 1744 of FIG. 3. The first portion 1741 is disposed between adjacent different sub-pixels R, G and B, and the second portion 1742 is disposed to correspond to the dummy sub-pixel DP. The fourth portion 1744 is disposed between the sub-pixel R and the dummy sub-pixel DP adjacent to each other. Meanwhile, as described above, the third portion 1743 of FIG. 3 is disposed between the adjacent dummy sub-pixels DP along the first direction. The third portion 1743 of FIG. 3 is disposed between first portion 1741 and the second portion 1742 along the second direction and is connected to the first portion 1741 and the second portion 1742. In addition, the third portion 1743 of FIG. 3 is disposed between the second portion 1742 and the fourth portion 1744 along the second direction and is connected to the second portion 1742 and the fourth portion 1744.

Here, each of side surfaces of the first portion 1741 and the fourth portion 1744 has a reverse slope, and each of side surfaces of the second portion 1742 has a normal slope. That is, a top surface of each of the first portion 1741 and the fourth portion 1744 has a wider width than a bottom surface of each of the first portion 1741 and the fourth portion 1744. A top surface of the second portion 1742 has a narrower width than a bottom surface of the second portion 1742. In addition, each of side surfaces of the third portion 1743 of FIG. 3 has a reverse slope.

The side surfaces of the second portion 1742 having the normal slope overlap the dummy electrode 164. That is, the side surfaces of the second portion 1742 are disposed right over the top surface of the dummy electrode 164.

The second bank 174 can be formed of an organic insulating material having a hydrophobic property. Alternatively, the second bank 174 can be formed of an organic insulating material having a hydrophilic property and can be subjected to a hydrophobic treatment.

The hydrophilic first bank 172 and the hydrophobic second bank 174 can be formed of the same material and formed as one body.

A light-emitting layer 180 is formed on the first electrode 160 exposed through the opening 174*a* of the second bank 174 in each pixel region P. Here, a red light-emitting layer is formed in the red sub-pixel R, a green light-emitting layer is formed in the green sub-pixel G, and a blue light-emitting layer is formed in the blue sub-pixel B.

In addition, the light-emitting layer 180 is also formed on the first bank 172 exposed through the opening 174*a* of the second bank 174 between adjacent same color sub-pixels R, G and B. Namely, in FIG. 5, the green light-emitting layer 180 is also formed on the first bank 172 exposed through the opening 174*a* of the second bank 174 between adjacent green sub-pixels G. At this time, the light-emitting layer 180 on the first bank 172 is connected to the light-emitting layer 180 on the first electrode 160 in each pixel region P adjacent thereto to thereby form one body.

A dummy light-emitting layer 182 is formed on the dummy electrode 164 in the dummy sub-pixel region DP. Referring to FIG. 4, the dummy light-emitting layer 182 of the dummy sub-pixel region DP is spaced apart from the light-emitting layer 180 of the pixel region P adjacent thereto along the first direction, and referring to FIG. 5, the dummy light-emitting layer 182 of the dummy sub-pixel region DP is connected to the light-emitting layer 180 of the pixel region P adjacent thereto along the second direction to thereby form one body.

The light-emitting layer 180 is formed through a solution process. Here, the solutions dropped into respective pixel regions P corresponding to the same color sub-pixel column, for example, the green sub-pixel column through different nozzles are connected to each other, and the light-emitting layer 180 is formed by drying the solutions. Accordingly, a deviation in the dropping amounts between the nozzles is reduced or minimized, and thicknesses of the light-emitting layers 180 can be uniform in the respective pixel regions P. At this time, the dummy light-emitting layer 182 is formed simultaneously with the light-emitting layer 180.

Heights of the light-emitting layer 180 and the dummy light-emitting layer 182 formed through the solution process rise around the second bank 174 as it gets closer to the second bank 174. Since the side surfaces of the first portion 1741 of the second bank 174 have the reverse slope and the side surfaces of the second portion 1742 of the second bank 174 have the normal slope, the height of the light-emitting layer 180 at the side surface of the first portion 1741 is lower than the height of the dummy light-emitting layer 182 at the side surface of the second portion 1742. That is, in the present disclosure, the side surfaces of the second bank 174 corresponding to the pixel regions P are configured to have the reverse slope, and thus the pile-up phenomenon can be alleviated, thereby forming the light-emitting layers 180 with more uniform thicknesses.

Next, a second electrode 190 is formed on the light-emitting layer 180 and the second bank 174. At this time, the second electrode 190 on the light-emitting layer 180 is disconnected from the second electrode 190 on the first portion 1741 of the second bank 174 due to the side surface of the first portion 1741 of the second bank 174 having the reverse slope.

In addition, the second electrode 190 is formed on the dummy light-emitting layer 182. Since the side surface of the second portion 1742 of the second bank 174 has the normal slope, the second electrode 190 is also formed on the side surface of the second portion 1742, and the second electrode 190 on the dummy light-emitting layer 182 is connected to the second electrode 190 on the second portion 1742 of the second bank 174.

Meanwhile, the side surfaces of the fourth portion 1744 of the second bank 174 have the reverse slope, and thus the second electrode 190 on the dummy light-emitting layer 182 is disconnected from the second electrode 190 on the fourth portion 1744 of the second bank 174.

As described above, in the electroluminescent display device 1000 according to the first embodiment of the present disclosure, the light-emitting layers 180 of the same color sub-pixels R, G and B are connected to each other and formed as one body, thereby reducing or minimizing the deviation in the dropping amounts between the nozzles and uniformly forming the thicknesses of the light-emitting layers 180 of the sub-pixels R, G and B. Therefore, the mura can be prevented, thereby preventing the image quality of the display device from being lowered.

In addition, since the side surfaces of the second bank 174 in the display area DA of FIG. 3 are configured to have the reverse slope, the pile-up phenomenon is alleviated, and thus, the thicknesses of the light-emitting layers 180 can be further uniform.

At this time, at least one side surface of the second bank 174 in the non-display area NDA of FIG. 3 is configured to have the normal slope. Accordingly, the second electrode 190 is continuously connected without disconnection in the non-display area NDA of FIG. 3, and the resistance of the second electrode 190 is prevented from increasing.

A manufacturing process of the electroluminescent display device 1000 according to the first embodiment of the present disclosure will be described in detail with reference to FIGS. 6A to 6E and FIGS. 7A to 7E.

FIGS. 6A to 6E and FIGS. 7A to 7E are cross-sectional views schematically illustrating a manufacturing process of an electroluminescent display device according to the first embodiment of the present disclosure. FIGS. 6A to 6E show cross-sections substantially corresponding to the line I-I' of FIG. 3, and FIGS. 7A to 7E show cross-sections substantially corresponding to the line II-II' of FIG. 3.

Figure 6A:
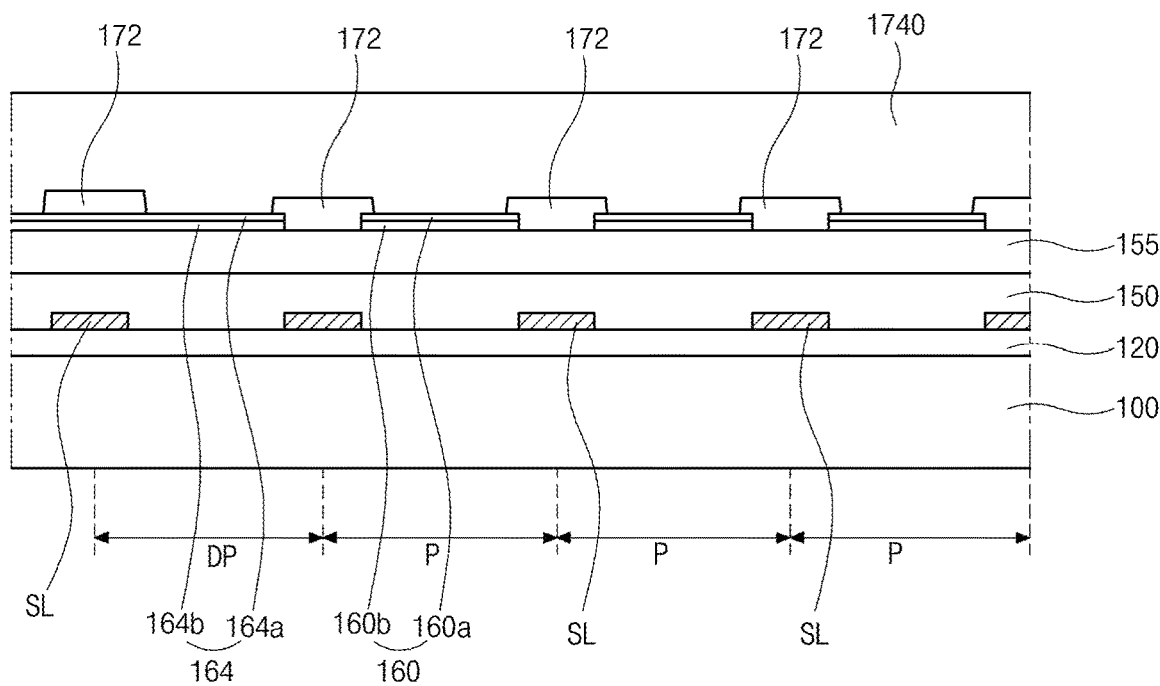
FIGS. 6A to 6E and FIGS. 7A to 7E are cross-sectional views schematically illustrating a manufacturing process of an electroluminescent display device according to the first embodiment of the present disclosure.
Figure 7A:
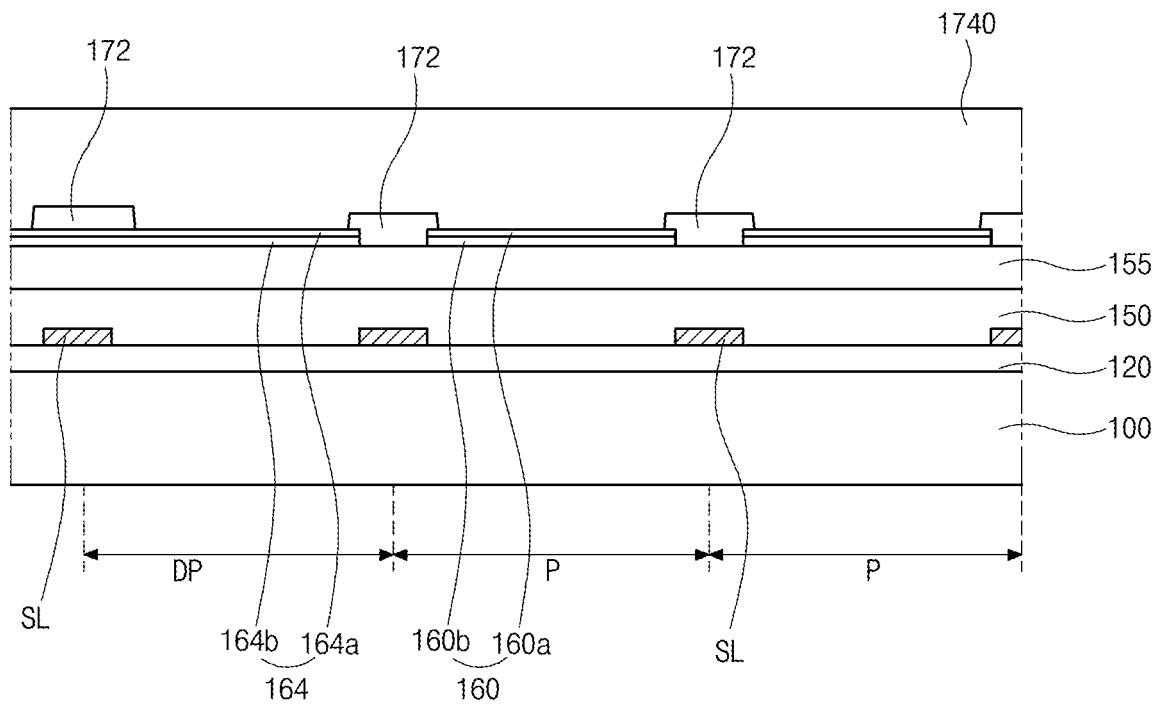

In FIG. 6A and FIG. 7A, the buffer layer 120, signal lines SL, the passivation layer 150 and the overcoat layer 155 are sequentially formed on the substrate 100, on which the pixel regions P respectively corresponding to the red, green and blue sub-pixels R, G and B and the dummy sub-pixel region DP corresponding to the dummy sub-pixel are defined. The pixel regions P are disposed in the display area, and the dummy sub-pixel region DP is disposed in the non-display area.

Here, the signal lines SL can be a gate line, a data line or a high voltage supply line, but is not limited thereto. In the present disclosure, the signal line SL is also formed in the dummy sub-pixel region DP to eliminate the level difference between the dummy sub-pixel region DP and the pixel region P, but the signal line SL in the dummy sub-pixel region DP can be omitted.

Further, although not shown in the figures, one or more thin film transistors and capacitors having the configuration shown in FIG. 2 can be formed between the buffer layer 120 and the passivation layer 150.

Then, a metal material having relatively high reflectance and a conductive material having relatively high work function are sequentially deposited on the overcoat layer 155 and patterned through a photolithographic process using a photomask, thereby forming the first electrode 160 in each pixel region P and the dummy electrode 164 in the dummy sub-pixel region DP.

Each of the first electrode 160 and the dummy electrode 164 includes the first layer 160a and 164a and the second layer 160b and 164b. The first layer 160a and 164a are formed of the metal material having relatively high reflectance, and the second layer 160b and 164b are formed of the conductive material having relatively high work function.

Next, the first bank 172 of an insulating material is formed on the first electrode 160 and the dummy electrode 164. The first bank 172 can be formed by depositing a material having a hydrophilic property, for example, an inorganic insulating material such as silicon oxide ($SiO_2$) or silicon nitride (SiNx) and patterning it through a photolithographic process using a photomask. Alternatively, the first bank 172 can be formed by applying polyimide and patterning it.

The first bank 172 corresponds to a boundary between adjacent pixel regions P and covers the edges of the first electrode 160. The signal line SL can be disposed under the first bank 172.

Meanwhile, the first bank 172 corresponding to the dummy sub-pixel region DP overlaps the dummy electrode 164. At this time, both ends of the first bank 172 are disposed on the top surface of the dummy electrode 164. In addition, the first bank 172 can overlap and cover an edge of the dummy electrode 164 adjacent to the pixel region P.

Then, a bank material layer 1740 is formed of an insulating material and substantially over the entire surface of the substrate 100. The bank material layer 1740 can be formed by applying an organic insulating material having the hydrophobic property, but is not limited thereto.

Figure 6B:
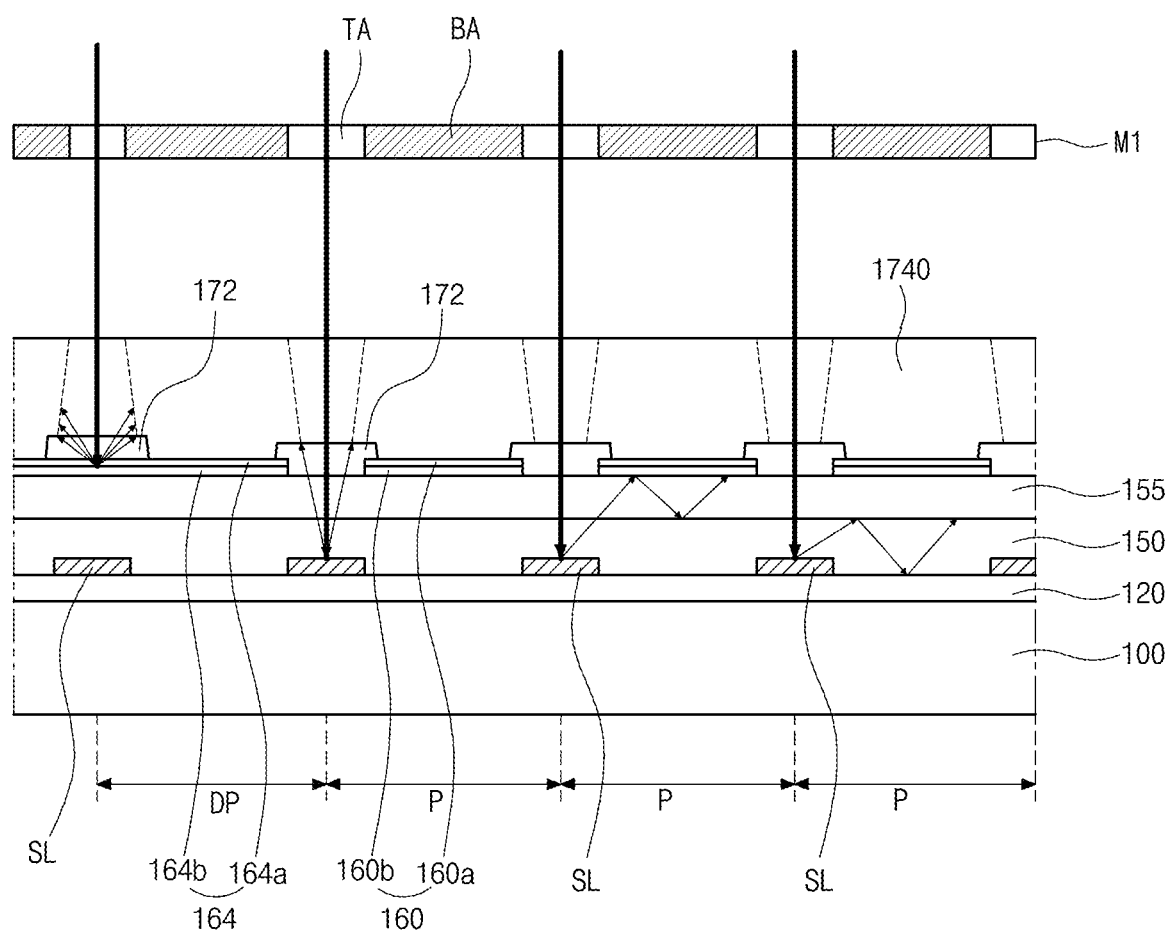
Figure 7B:
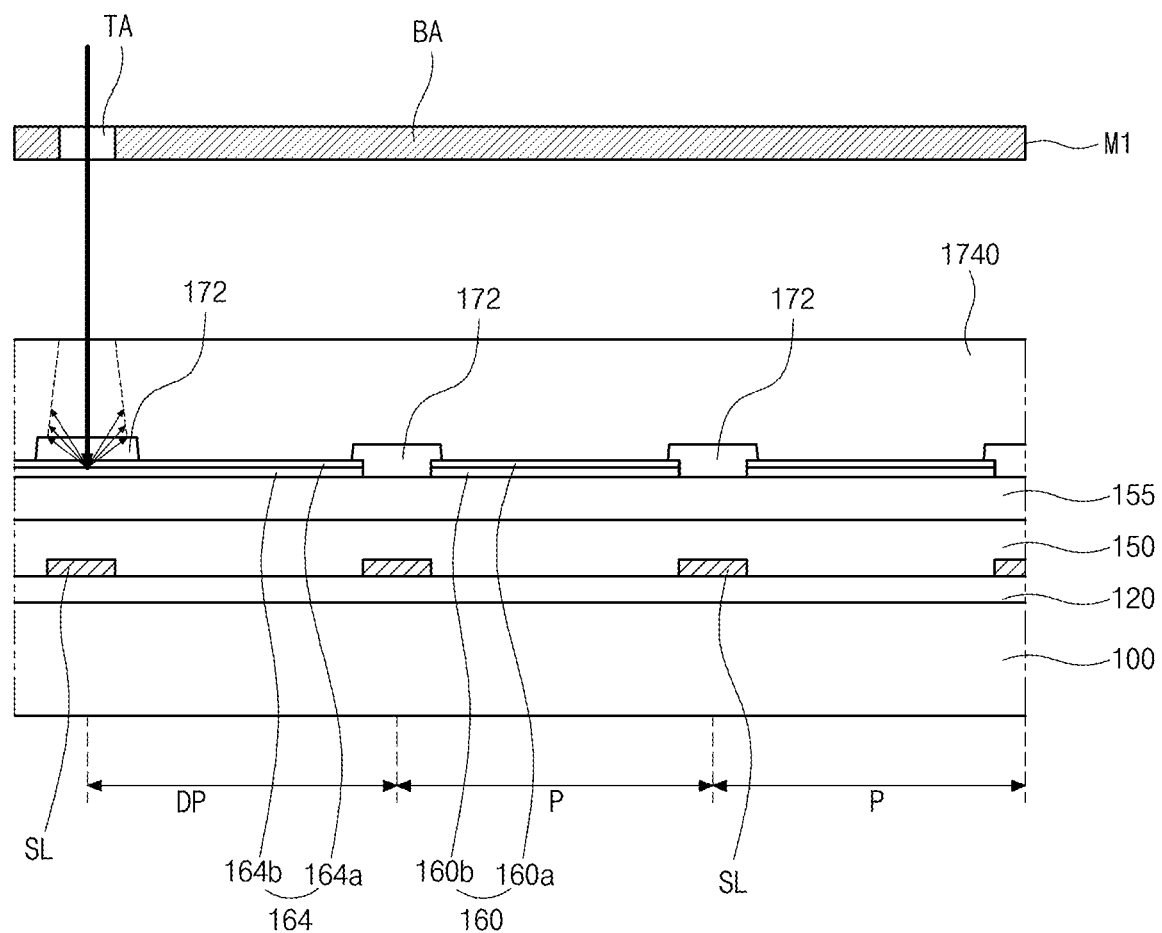

Next, in FIG. 6B and FIG. 7B, a photomask M1 is disposed over the bank material layer 1740. The photomask M1 includes a light-transmitting portion TA and a light-blocking portion BA. The bank material layer 1740 can be a negative photosensitive type in which a portion exposed to light remains after developing. At this time, the light-transmitting portion TA corresponds to the second bank to be formed later.

Then, the bank material layer 1740 is exposed to light through the photomask M1. Here, light passing through the light-transmitting portion TA corresponding to the dummy sub-pixel region DP is reflected by the second layer 164b of the dummy electrode 164 under the first bank 172, so that the reflectance is increased.

On the other hand, light passing through the light-transmitting portion TA corresponding to the pixel region P is reflected by the signal line SL under the passivation layer 150 or is totally reflected by interfaces between the signal line SL and the second layer 160b of the first electrode 160 or interfaces between the signal line SL and the insulation layers 120, 150 and 155 to thereby disappear, so that the reflectance is lowered.

Here, it is preferable that the reflectance in the non-display area corresponding to the dummy sub-pixel region DP is 70~90% and the reflectance in the display area corresponding to the pixel region P is 10~30%.

Meanwhile, the reflectance can be controlled by the thickness and the refractive index n of the first layer 164a of the dummy electrode 164, the first bank 172 and the bank material layer 1740. For example, the first layer 164a of the dummy electrode 164 is formed of ITO (n=2.03) and has the thickness of 10 nm, the first bank 172 is formed of polyimide (n=1.5) and has the thickness of 1000 nm, and the bank material layer 1740 is formed of an organic material (n=1.6) and has the thickness of 1200 nm. In this case, the reflectance corresponding to the dummy sub-pixel region DP can be 79.1%, and the reflectance corresponding to the pixel region P can be 17.3%.

Figure 6C:
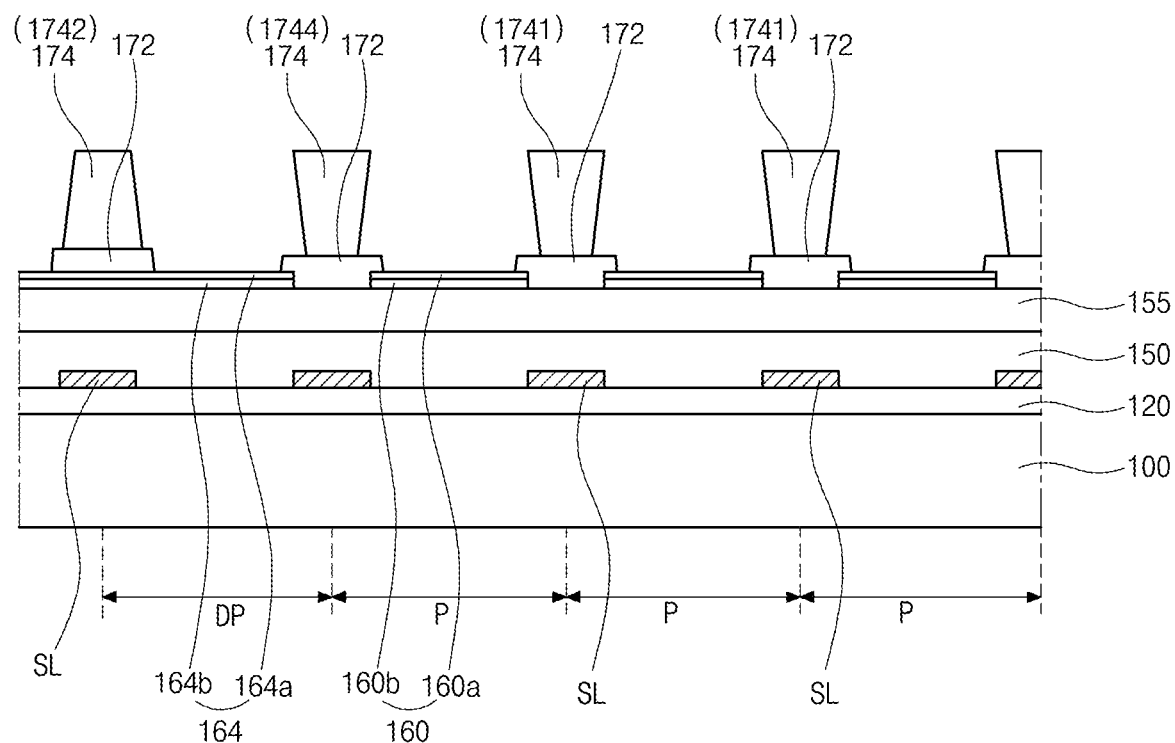
Figure 7C:
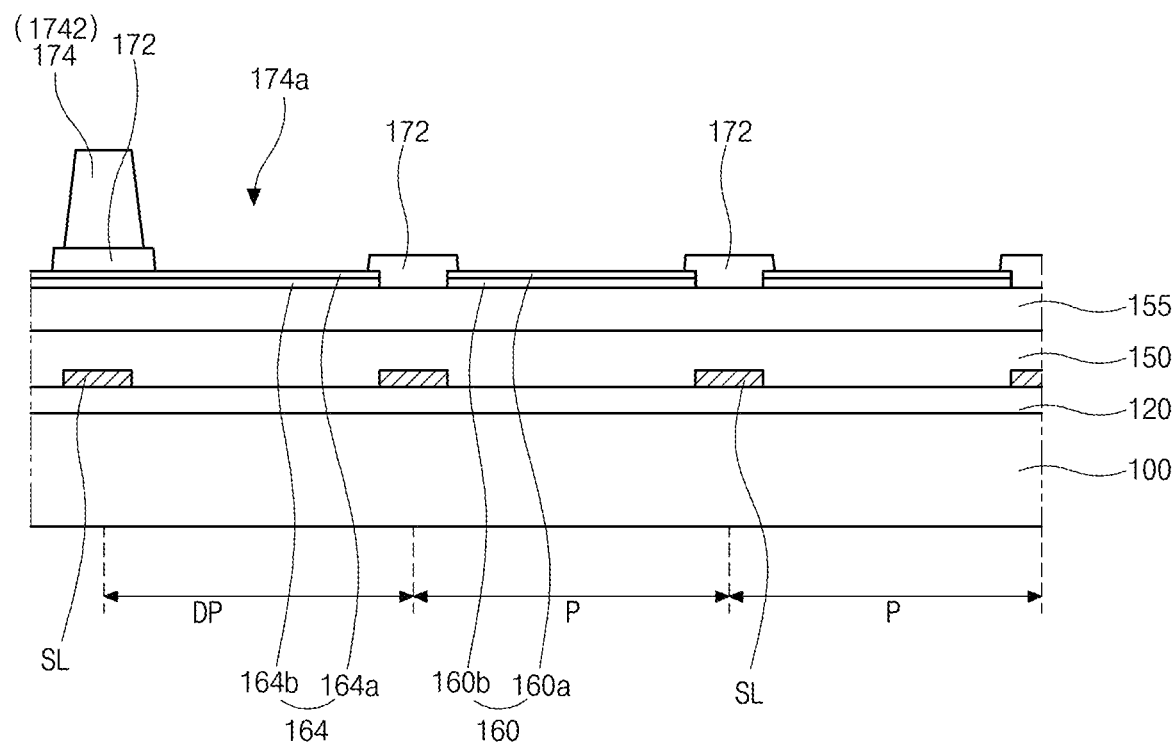

Next, in FIG. 6C and FIG. 7C, the bank material layer 1740 of FIG. 6B and FIG. 7B exposed to light is developed, thereby forming the second bank 174.

The second bank 174 has the opening 174a corresponding to the same color sub-pixel column and exposes the first electrodes 160 of the same color sub-pixel column and the first bank 172 between adjacent first electrodes 160 through the opening 174a. In addition, the opening 174a is also formed to correspond to the dummy sub-pixel region DP adjacent to the same color sub-pixel column, and the dummy electrode 164 is exposed through the opening 174a.

The second bank 174 includes the first, second, third, and fourth portions 1741, 1742, 1743 and 1744 of FIG. 3. The side surfaces of the first portion 1741 and the fourth portion 1744 have the reverse slope, and the side surfaces of the second portion 1742 have the normal slope. That is, the top surface of each of the first portion 1741 and the fourth portion 1744 has the wider width than the bottom surface of each of the first portion 1741 and the fourth portion 1744. The top surface of the second portion 1742 has the narrower width than the bottom surface of the second portion 1742. In addition, the side surfaces of the third portion 1743 of FIG. 3 have the reverse slope.

Figure 6D:
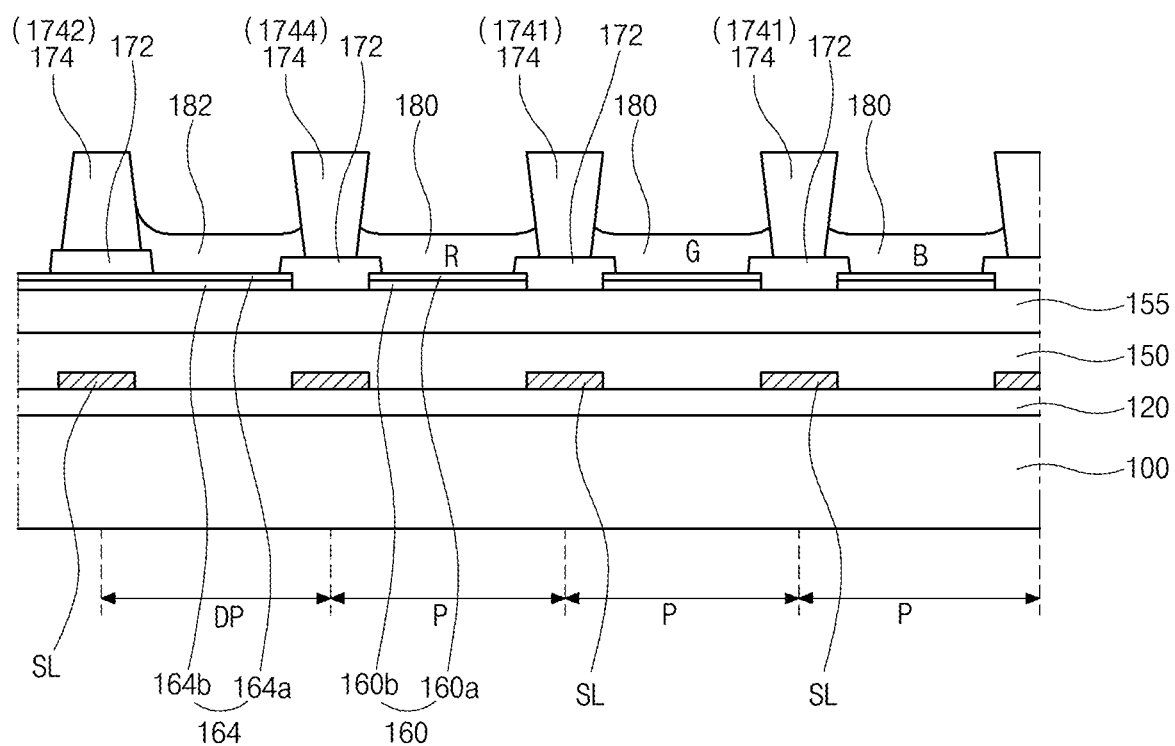
Figure 7D:
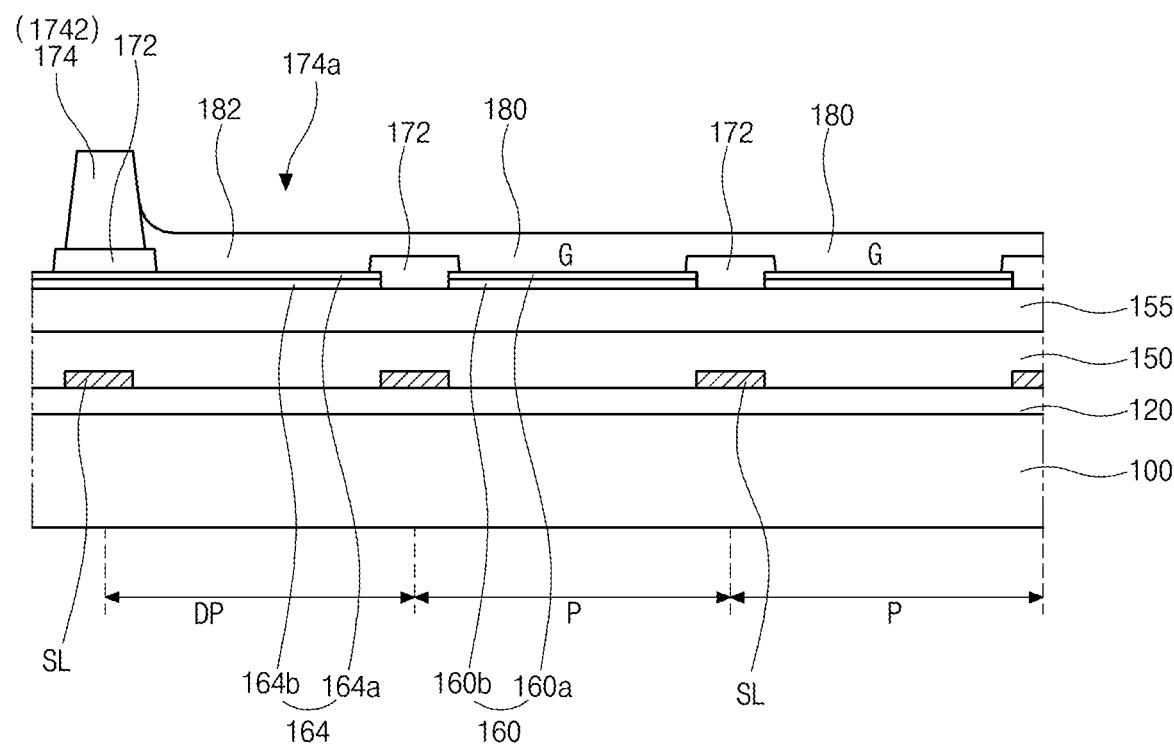

Next, in FIG. 6D and FIG. 7D, a solution of a light-emitting material is dropped in each pixel region P and the dummy pixel region DP using an injection apparatus (not shown) including a plurality of nozzles and is dried to thereby evaporate the solvent. Therefore, the light-emitting layer 180 is formed in the pixel region P and the dummy light-emitting layer 182 is formed in the dummy sub-pixel region DP.

The light-emitting layers 180 of the same color sub-pixel column are connected to each other and formed as one body.

In addition, the dummy light-emitting layer 182 of the dummy sub-pixel region DP is connected to the light-emitting layer 180 of the same color sub-pixel column adjacent thereto and is formed as one body.

At this time, the solvent can be evaporated by performing a vacuum dry process. By the way, when the solution is dried, the drying speed of the solvent in the region adjacent to the second bank 174 is different from that in other regions, and the height of the light-emitting layer 180 in the region adjacent to the second bank 174 can rise as it gets closer to the second bank 174.

Here, since the side surface of the first portion 1741 of the second bank 174 has the reverse slope and the side surface of the second portion 1742 of the second bank 174 has the normal slope, the height of the light-emitting layer 180 at the side surface of the first portion 1741 is lower than the height of the dummy light-emitting layer 182 at the side surface of the second portion 1742. Accordingly, it is possible to form the light-emitting layer 180 having the more uniform thickness.

Figure 6E:
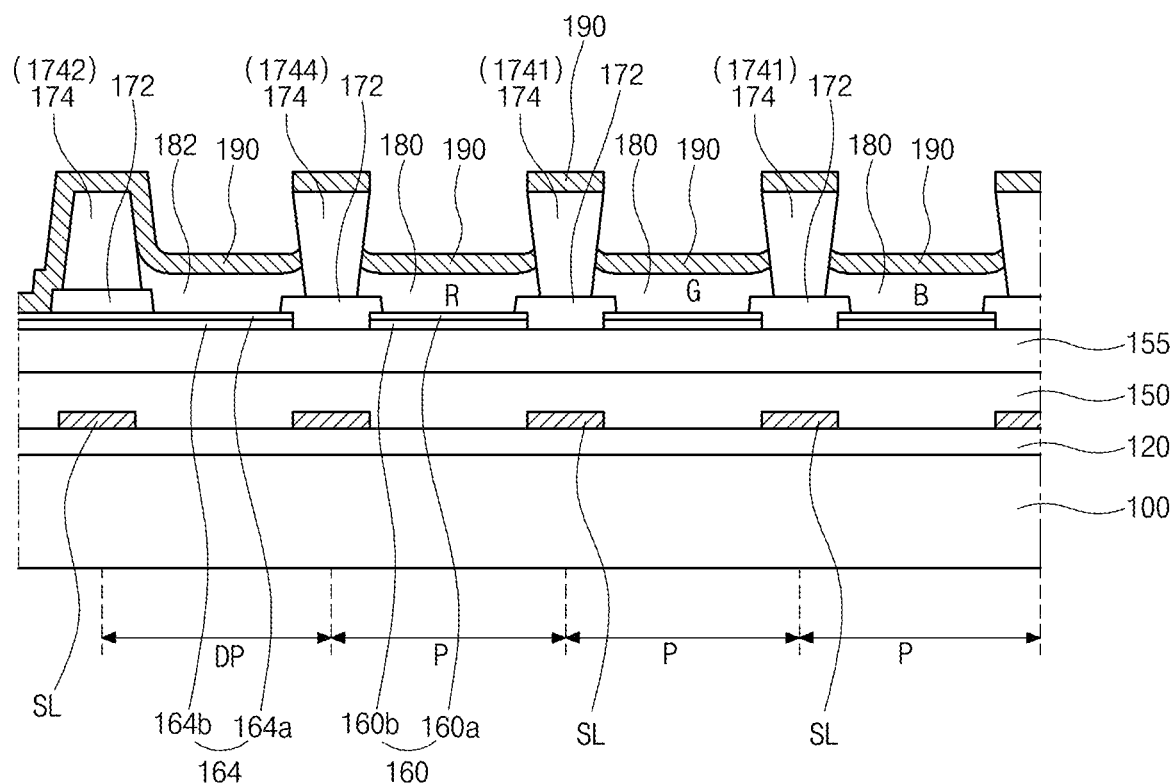
Figure 7E:
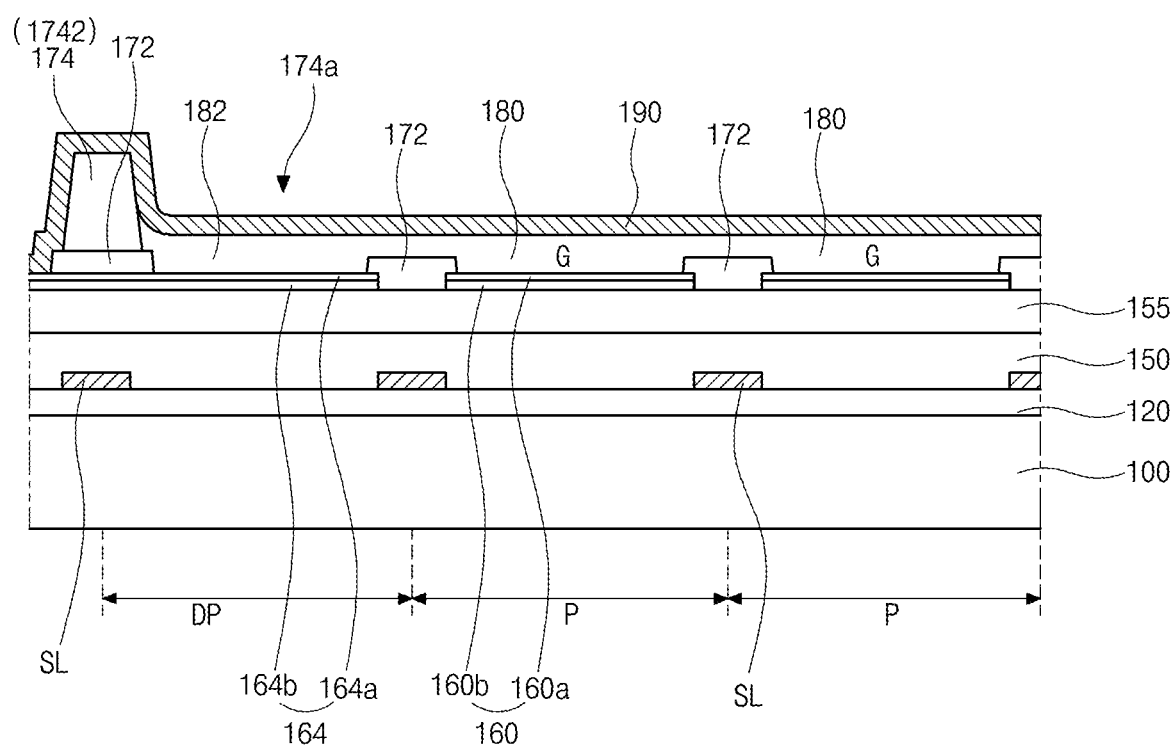

Next, in FIG. 6E and FIG. 7E, the second electrode 190 is formed on the light-emitting layer 180, the second bank 174 and the dummy light-emitting layer 182 substantially over the entire surface of the substrate 100 by depositing a conductive material having relatively low work function through a sputtering method or the like.

The second electrode 190 can be formed of aluminum (Al), magnesium (Mg), silver (Ag), or an alloy thereof. At this time, the second electrode 190 has the relatively thin thickness such that light from the light-emitting layer 180 can be transmitted therethrough. Alternatively, the second electrode 190 can be formed of a transparent conductive material such as indium-gallium-oxide (IGO) or IZO, but is not limited thereto.

Here, the second electrode 190 on the light-emitting layer 180 is disconnected from the second electrode 190 on the first portion 1741 due to the side surfaces of the first portion 1741 having the reverse slope. However, since the second electrode 190 is formed on the side surfaces of the second portion 1742 having the normal slope, the second electrode 190 on the dummy light-emitting layer 182 is connected to the second electrode 190 on the second portion 1742.

As described above, in the electroluminescent display device 1000 according to the first embodiment of the present disclosure, by forming the light-emitting layer 180 through the solution process, a display device with a large size and high definition can be implemented.

In addition, in the electroluminescent display device 1000 according to the first embodiment of the present disclosure, the light-emitting layers 180 of the same color pixel regions P are connected to each other and formed as one body, thereby reducing or minimizing the deviation in the dropping amounts between the nozzles and uniformly forming the thicknesses of the light-emitting layers 180 in the pixel regions P. Therefore, the mura can be prevented, thereby preventing the image quality of the display device from being lowered.

Further, while the side surfaces of the second bank 174 corresponding to the pixel region P are configured to have the reverse slope so that the light-emitting layers 180 of the pixel regions P have the uniform thickness, at least a part of the side surfaces of the second bank 174 corresponding to the dummy sub-pixel region DP is configured to have the normal slope, so that the second electrode 190 can be prevented from being disconnected and the resistance of the electrode 190 can be prevented from being increased.

At this time, the side surface of the second bank 174 having the normal slope and the side surface of the second bank 174 having the reverse slope can be simultaneously formed by controlling the location of the reflective layer under the second bank 174. Accordingly, it is possible to prevent the increase in the manufacturing process and costs.

Second Embodiment

Figure 8:
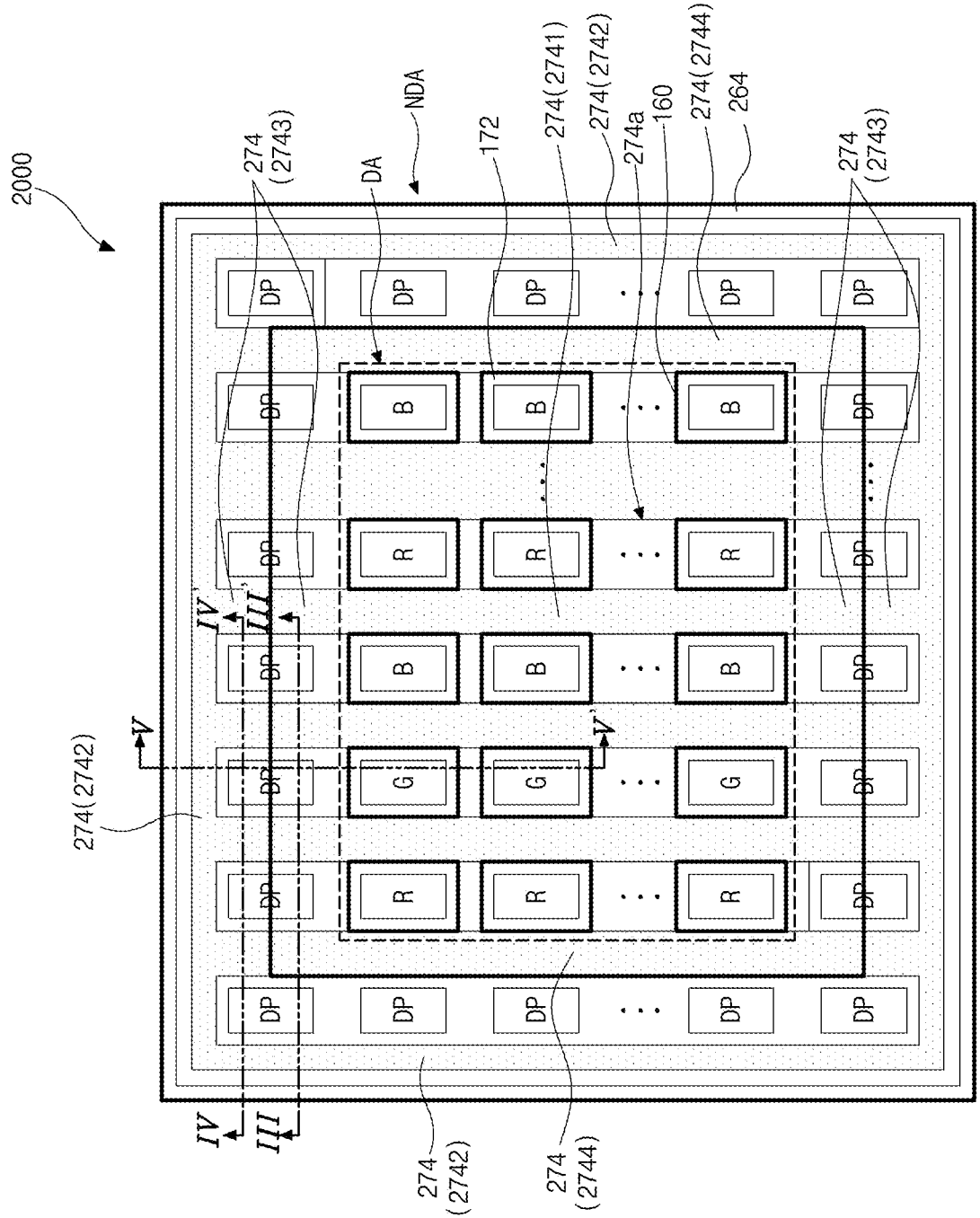
FIG. 8 is a schematic plan view of an electroluminescent display device according to a second embodiment of the present disclosure.

FIG. 8 is a schematic plan view of an electroluminescent display device according to a second embodiment of the present disclosure and mainly shows a bank configuration. The electroluminescent display device of the second embodiment has the same configuration as the electroluminescent display device of the first embodiment except for some elements. The same parts as those of the first embodiment are designated by the same reference signs, and explanation for the same parts will be shortened or omitted.

In FIG. 8, the electroluminescent display device 2000 according to the second embodiment of the present disclosure includes a display area DA displaying an image and a non-display area NDA surrounding the display area DA.

In the display area DA, red, green and blue sub-pixels R, G and B are disposed. The red, green and blue sub-pixels R, G and B are sequentially arranged along the first direction (e.g., horizontal direction), and the same color sub-pixels R, G and B are arranged along the second direction (e.g., vertical direction).

A plurality of dummy sub-pixels DP are disposed in the non-display area NDA. The number of the dummy sub-pixels DP is not limited to illustration and can vary as needed.

A first electrode 160 is disposed at each of the red, green and blue sub-pixels R, G and B of the display area DA, and a dummy electrode 264 is disposed at each of the dummy sub-pixels DP of the non-display area NDA. The first electrode 160 and the dummy electrode 264 are formed of the same material and on the same layer.

Here, the dummy electrodes 264 of the dummy sub-pixels DP are connected to each other and formed as one body. The dummy electrodes 264 can be configured to surround the display area DA.

A bank is disposed to correspond to the sub-pixels R, G and B of the display area DA and the dummy sub-pixels DP of the non-display area NDA. The bank includes a first bank 172 of a hydrophilic property and a second bank 274 of a hydrophobic property.

More specifically, the first bank 172 is disposed between adjacent same color sub-pixels R, G and B and between adjacent different color sub-pixels R, G and B in the display area DA. In addition, the first bank 172 is disposed between adjacent dummy sub-pixels DP along the first and second directions in the non-display area NDA and surrounds outer edges of the non-display area NDA.

Next, the second bank 274 is disposed on the first bank 172. The second bank 274 has an opening 274a corresponding to each of a same color sub-pixel column along the second direction in the display area DA and a dummy sub-pixel column along the second direction in the non-display area NDA. The second bank 274 is disposed between adjacent different color sub-pixels R, G and B along the first direction in the display area DA and is disposed between the sub-pixel R or B and the dummy sub-pixel DP adjacent along the first direction in the non-display area NDA. At this time, the opening 274a corresponding to the same color sub-pixel column of the second direction can extend into the dummy sub-pixel DP of the non-display area NDA adjacent thereto along the second direction.

The second bank 274 includes first, second, third and fourth portions 2741, 2742, 2743 and 2744. The first portion 2741 is disposed in the display area DA, the second and third portions 2742 and 2743 are disposed in the non-display area NDA, and the fourth portion 2744 is disposed in a boundary between the display area DA and the non-display area NDA adjacent along the first direction.

More particularly, the first portion 2741 is disposed between the adjacent sub-pixels R, G and B along the first direction, and the second portion 2742 is disposed to surround the outer edge of the non-display area NDA. The third portion 2743 is disposed between the adjacent dummy sub-pixels DP along the first direction, and the fourth portion 2744 is disposed between the sub-pixel R or B and the dummy sub-pixel DP adjacent along the first direction. Here, the third portion 2743 is disposed between the first portion 2741 and the second portion 2742 along the second direction and is connected to the first portion 2741 and the second portion 2742. In addition, the third portion 2743 is disposed between the second portion 2742 and the fourth portion 2744 along the second direction and is connected to the second portion 2742 and the fourth portion 2744.

The second portion 2742 of the second bank 274 completely overlaps the dummy electrode 264, and the third portion 2743 of the second bank 274 partially overlaps the dummy electrode 264, and the fourth portion 2744 of the second bank 274 does not overlap the dummy electrode 264.

A cross-sectional structure of the electroluminescent display device 2000 according to the second embodiment of the present disclosure will be described in detail with reference to FIG. 9, FIG. 10 and FIG. 11.

Figure 9:
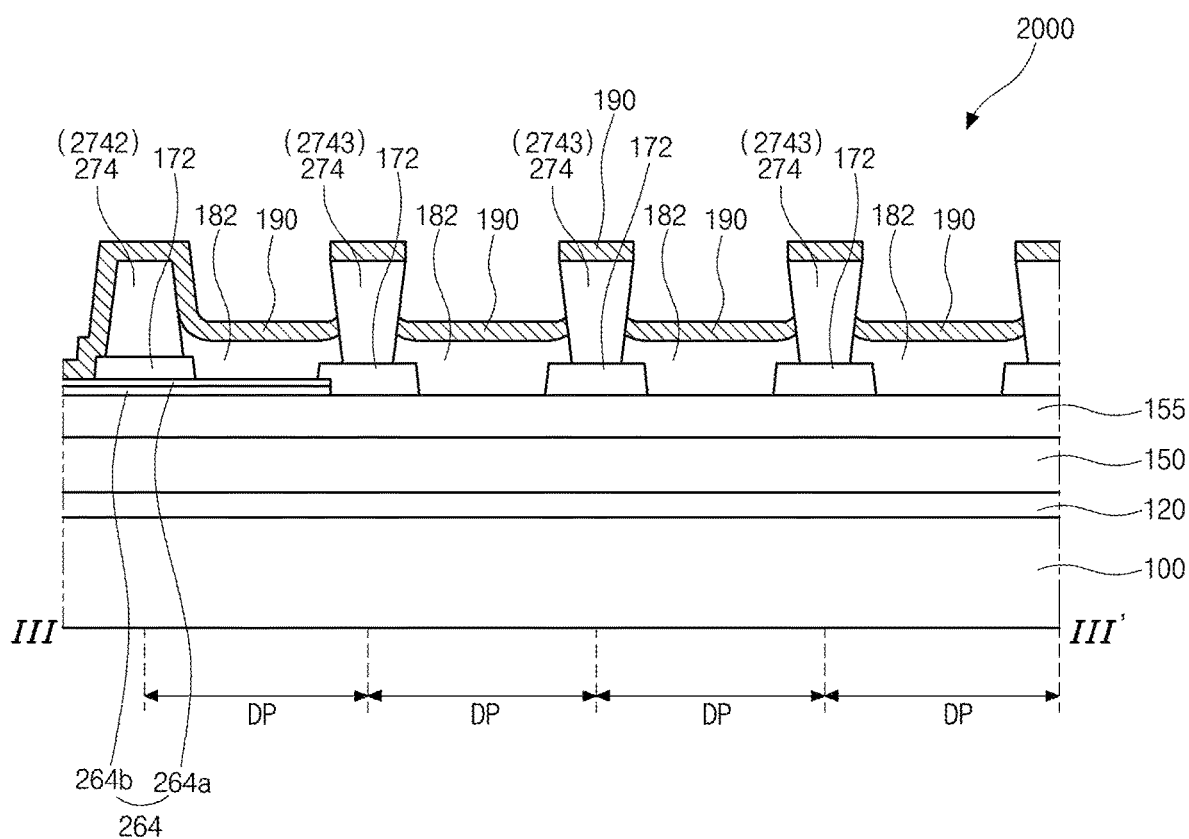
FIG. 9 is a cross-sectional view corresponding to the line III-III' of FIG. 8 according to an embodiment of the present disclosure.
Figure 10:
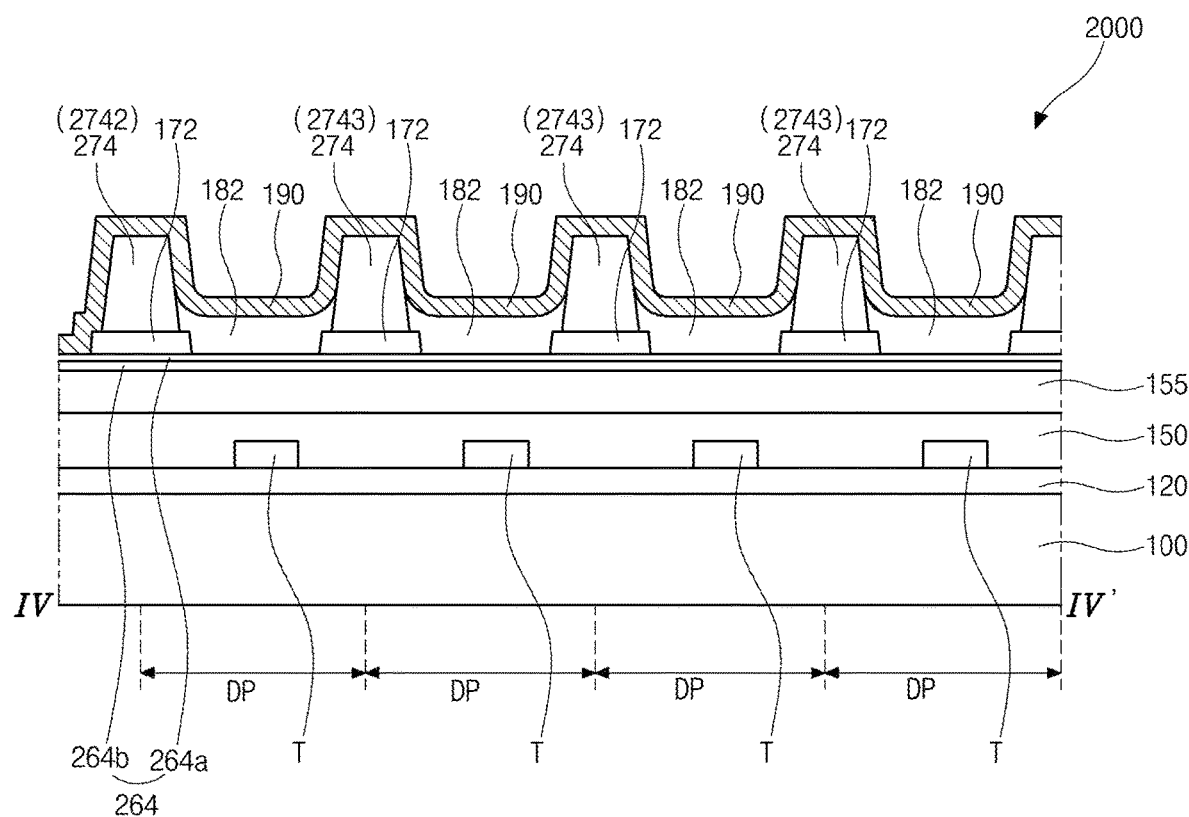
FIG. 10 is a cross-sectional view corresponding to the line IV-IV' of FIG. 8 according to an embodiment of the present disclosure.
Figure 11:
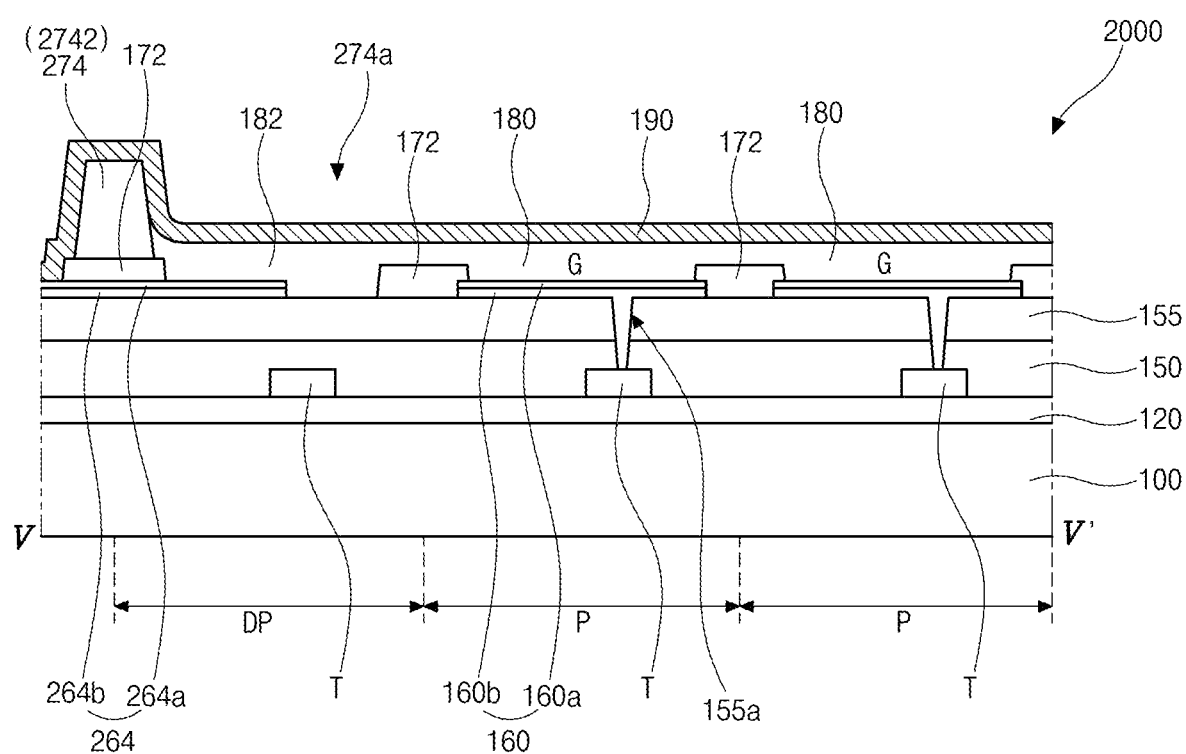
FIG. 11 is a cross-sectional view corresponding to the line V-V' of FIG. 8 according to an embodiment of the present disclosure.

FIG. 9 is a cross-sectional view corresponding to the line III-III' of FIG. 8, FIG. 10 is a cross-sectional view corresponding to the line IV-IV' of FIG. 8, and FIG. 11 is a cross-sectional view corresponding to the line V-V' of FIG. 8. The dummy sub-pixel DP and the red, green and blue sub-pixels R, G and B sequentially arranged along the first direction in FIG. 8 have the same structures as that shown in FIG. 4, and illustration and description for these will be omitted.

As shown in FIG. 9, FIG. 10 and FIG. 11, the plurality of pixel regions P respectively corresponding to the red, green and blue sub-pixels R, G and B and the dummy sub-pixel region DP corresponding to the dummy sub-pixel are defined on the substrate 100, and the buffer layer 120, the thin film transistors T, the passivation layer 150 and the overcoat layer 155 are sequentially formed on the substrate 100.

Here, each thin film transistor T can have the configuration shown in FIG. 2, but is not limited thereto. In addition, although not shown in the figure, the gate insulation layer and/or the interlayer insulation layer can be further formed between the buffer layer 120 and the passivation layer 150.

In each pixel region P, the overcoat layer 155 has the drain contact hole 155a exposing a part of the thin film transistor T, that is, the drain electrode together with the passivation layer 150.

The first electrode 160 is formed in each pixel region P on the overcoat layer 155, and the dummy electrode 264 is formed in the dummy sub-pixel region DP on the overcoat layer 155. The first electrode 160 contacts the drain electrode of the thin film transistor T through the drain contact hole 155a.

On the other hand, the passivation layer 150 and the overcoat layer 155 do not have a drain contact hole in the dummy sub-pixel region DP, and the dummy electrode 264 is not connected to the thin film transistor T in the dummy sub-pixel region DP.

Meanwhile, the thin film transistor T of the dummy sub-pixel region DP can be omitted.

Each of the first electrode 160 and the dummy electrode 264 includes the first layer 160a and 264a and the second layer 160b and 264b, and the second layer 160b and 264b is disposed between the first layer 160a and 264a and the substrate 100, more particularly, between the first layer 160a and 264a and the overcoat layer 155.

The first layer 160a and 264a is formed of a conductive material having relatively high work function, and the second layer 160b and 264b is formed of a metal material having relatively high reflectance. The second layer 160b and 264b serves as a reflective layer.

The first bank 172 of a hydrophilic property is formed on the first electrode 160 and the dummy electrode 264. The first bank 172 overlaps and covers edges of the first electrode 160 of the pixel region P. The first bank 172 is formed between adjacent same color sub-pixels R, G and B and between adjacent different color sub-pixels R, G and B.

Meanwhile, a part of the first bank 172 is formed on the dummy electrode 264 of the dummy sub-pixel region DP and overlaps and covers edges of the dummy electrode 264 of the dummy sub-pixel region DP. At this time, the both ends of the first bank 172 are disposed on the top surface of the dummy electrode 264. In addition, the first bank 172 can be spaced apart from one edge of the dummy electrode 264 adjacent to the pixel region P and can overlap and cover another edge of the dummy electrode 264 adjacent to another dummy sub-pixel region DP.

The first bank 172 can be formed of a material having a hydrophilic property, for example, an inorganic insulating material such as silicon oxide ($SiO_2$) or silicon nitride (SiNx). Alternatively, the first bank 172 can be formed of polyimide.

The second bank 274 of a hydrophobic property is formed on the first bank 172. The second bank 274 has a thicker thickness than the first bank 172 and a narrower width than the first bank 172.

The second bank 274 has an opening 274a corresponding to a same color sub-pixel column and exposes the first electrodes 160 of the same color sub-pixel column and the first bank 172 between adjacent first electrodes 160 through the opening 274a. In addition, the opening 274a extends into the dummy sub-pixel region DP adjacent to the same color sub-pixel column, and the dummy electrode 264 is exposed through the opening 274a.

The second bank 274 includes the first, second, third, and fourth portions 2741, 2742, 2743, and 2744 of FIG. 8. The first portion 2741 of FIG. 8 is disposed between adjacent different sub-pixels R, G and B, and the second portion 2742 is disposed to correspond to the dummy sub-pixel DP. The third portion 2743 is disposed between the adjacent dummy sub-pixels DP along the first direction in FIG. 8, and the fourth portion 2744 of FIG. 8 is disposed between the sub-pixel R and the dummy sub-pixel DP adjacent to each other along the first direction in FIG. 8. Meanwhile, the third portion 2743 is disposed between the first portion 2741 and the second portion 2742 of FIG. 8 along the second direction in FIG. 8 and is connected to the first portion 2741 and the second portion 2742 of FIG. 8. In addition, the third portion 2743 is disposed between the second portion 2742 and the fourth portion 2744 of FIG. 8 along the second direction in FIG. 8 and is connected to the second portion 2742 and the fourth portion 2744 of FIG. 8.

Here, each of side surfaces of the first portion 2741 of FIG. 8 and the fourth portion 2744 of FIG. 8 has a reverse slope, and each of side surfaces of the second portion 2742 has a normal slope. That is, a top surface of each of the first portion 2741 of FIG. 8 and the fourth portion 2744 of FIG. 8 has a wider width than a bottom surface of each of the first portion 2741 of FIG. 8 and the fourth portion 2744 of FIG. 8. A top surface of the second portion 2742 has a narrower width than a bottom surface of the second portion 2742.

In addition, a first part of a side surface of the third portion 2743 has a reverse slope and a second part of the side surface of the third portion 2743 has a normal slope. More particularly, the first part of the side surface of the third portion 2743 adjacent to the first portion 2741 of FIG. 8 has the reverse slope, and the second part of the side surface of the third portion 2743 adjacent to the second portion 2742 has the normal slope. Accordingly, an area where the inclination direction changes between the normal slope and the reverse slope, that is, a border between the normal slope and the reverse slope is disposed in the non-display area NDA of FIG. 8, and thus the it is possible to prevent the problem due to the change of the inclination direction.

The side surfaces of the second portion 2742 and the third portion 2743 having the normal slope overlap the dummy electrode 264. That is, the side surfaces of the second portion 2742 and the second part of the side surfaces of the third portion 2743 are disposed over the top surface of the dummy electrode 264.

The second bank 274 can be formed of an organic insulating material having a hydrophobic property. Alternatively, the second bank 274 can be formed of an organic insulating material having a hydrophilic property and can be subjected to a hydrophobic treatment.

The hydrophilic first bank 172 and the hydrophobic second bank 274 can be formed of the same material and formed as one body.

The light-emitting layer 180 is formed on the first electrode 160 exposed through the opening 274a of the second bank 274 in each pixel region P. Here, a red light-emitting layer is formed in the red sub-pixel R, a green light-emitting layer is formed in the green sub-pixel G, and a blue light-emitting layer is formed in the blue sub-pixel B.

In addition, the light-emitting layer 180 is also formed on the first bank 172 exposed through the opening 274a of the second bank 274 between adjacent same color sub-pixels R, G and B. Namely, in FIG. 11, the green light-emitting layer 180 is also formed on the first bank 172 exposed through the opening 274a of the second bank 274 between adjacent green sub-pixels G. At this time, the light-emitting layer 180 on the first bank 172 is connected to the light-emitting layer 180 on the first electrode 160 in each pixel region P adjacent thereto to thereby form one body.

The dummy light-emitting layer 182 is formed on the dummy electrode 264 in the dummy sub-pixel region DP. Referring to FIG. 8, the dummy light-emitting layers 182 of the adjacent dummy sub-pixel regions DP along the first direction are spaced apart from each other, and the dummy light-emitting layer 182 of the dummy sub-pixel region DP is connected to the light-emitting layer 180 of the pixel region P adjacent thereto along the second direction to thereby form one body. Although not shown in the figures, the dummy light-emitting layer 182 of the dummy sub-pixel region DP is spaced apart from the light-emitting layer 180 of the pixel region P adjacent thereto along the first direction.

The light-emitting layer 180 is formed through a solution process. Here, the solutions dropped into respective pixel regions P corresponding to the same color sub-pixel column, for example, the green sub-pixel column through different nozzles are connected to each other, and the light-emitting layer 180 is formed by drying the solutions. Accordingly, a deviation in the dropping amounts between the nozzles is minimized, and thicknesses of the light-emitting layers 180 can be uniform in the respective pixel regions P. At this time, the dummy light-emitting layer 182 is formed simultaneously with the light-emitting layer 180.

Heights of the light-emitting layer 180 and the dummy light-emitting layer 182 formed through the solution process rise around the second bank 274 as it gets closer to the second bank 274. Since the side surfaces of the first portion 2741 of the second bank 274 have the reverse slope and the side surfaces of the second portion 2742 of the second bank 274 have the normal slope, the heights of the light-emitting layer 180 at the side surfaces of the first portion 2741 are lower than the height of the dummy light-emitting layer 182 at the side surface of the second portion 2742. That is, in the present disclosure, the side surfaces of the second bank 274 corresponding to the pixel regions P are configured to have the reverse slope, and thus the pile-up phenomenon can be alleviated, thereby forming the light-emitting layers 180 with more uniform thicknesses.

Next, the second electrode 190 is formed on the light-emitting layer 180 and the second bank 274. At this time, the second electrode 190 on the light-emitting layer 180 is disconnected from the second electrode 190 on the first portion 2741 of the second bank 274 due to the side surface of the first portion 2741 of the second bank 274 having the reverse slope.

In addition, the second electrode 190 is formed on the dummy light-emitting layer 182. Since the side surface of the second portion 2742 of the second bank 274 has the normal slope, the second electrode 190 is also formed on the side surface of the second portion 2742, and the second electrode 190 on the dummy light-emitting layer 182 is connected to the second electrode 190 on the second portion 2742 of the second bank 274.

Further, the first part of the side surface of the third portion 2743 has the reverse slope, and the second part of the side surface of the third portion 2743 has the normal slope. Thus, the second electrode 190 on the dummy light-emitting layer 182 is disconnected from the second electrode 190 on the third portion 2743 due to the first part of the side surface of the third portion 2743 having the reverse slope. On the other hand, the second electrode 190 on the dummy light-emitting layer 182 is connected to the second electrode 190 on the third portion 2743 due to the second part of the side surface of the third portion 2743 having the normal slope.

Meanwhile, the side surfaces of the fourth portion 2744 of FIG. 8 have the reverse slope, and thus the second electrode 190 on the dummy light-emitting layer 182 is disconnected from the second electrode 190 on the fourth portion 2744 of the second bank 274.

As described above, in the electroluminescent display device 2000 according to the second embodiment of the present disclosure, the second electrode 190 is less disconnected in the non-display area NDA of FIG. 8 as compared with the first embodiment, and the resistance of the second electrode 190 can be further prevented from being increased.

Third Embodiment

Figure 12:
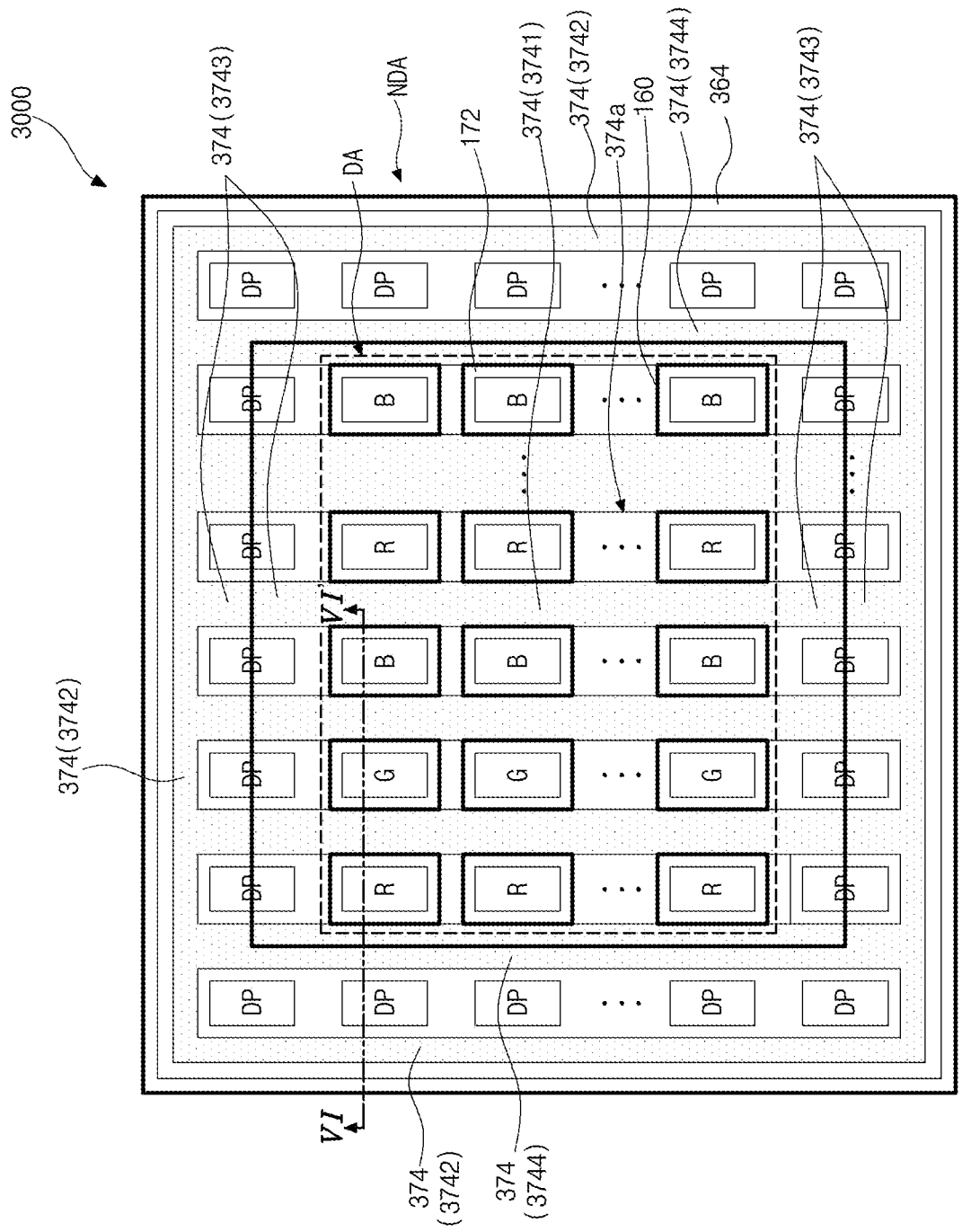
FIG. 12 is a schematic plan view of an electroluminescent display device according to a third embodiment of the present disclosure.

FIG. 12 is a schematic plan view of an electroluminescent display device according to a third embodiment of the present disclosure and mainly shows a bank configuration.

The electroluminescent display device of the third embodiment has the same configuration as the electroluminescent display devices of the first and second embodiments except for some elements. The same parts as those of the first and second embodiments are designated by the same reference signs, and explanation for the same parts will be shortened or omitted.

In FIG. 12, the electroluminescent display device 3000 according to the third embodiment of the present disclosure includes a display area DA displaying an image and a non-display area NDA surrounding the display area DA.

In the display area DA, red, green and blue sub-pixels R, G and B are disposed. The red, green and blue sub-pixels R, G and B are sequentially arranged along a first direction (e.g., horizontal direction), and the same color sub-pixels R, G and B are arranged along a second direction (e.g., vertical direction).

A plurality of dummy sub-pixels DP are disposed in the non-display area NDA. The number of the dummy sub-pixels DP is not limited to illustration and can vary as needed.

A first electrode 160 is disposed at each of the red, green and blue sub-pixels R, G and B of the display area DA, and a dummy electrode 364 is disposed at each of the dummy sub-pixels DP of the non-display area NDA. The first electrode 160 and the dummy electrode 364 are formed of the same material and on the same layer.

Here, the dummy electrodes 364 of the dummy sub-pixels DP are connected to each other and formed as one body. The dummy electrodes 364 can be configured to surround the display area DA.

A bank is disposed to correspond to the sub-pixels R, G and B of the display area DA and the dummy sub-pixels DP of the non-display area NDA. The bank includes a first bank 172 of a hydrophilic property and a second bank 374 of a hydrophobic property.

More specifically, the first bank 172 is disposed between adjacent same color sub-pixels R, G and B and between adjacent different color sub-pixels R, G and B in the display area DA. In addition, the first bank 172 is disposed between adjacent dummy sub-pixels DP along the first and second directions in the non-display area NDA and surrounds outer edges of the non-display area NDA.

Next, the second bank 374 is disposed on the first bank 172. The second bank 374 has an opening 374a corresponding to each of a same color sub-pixel column along the second direction in the display area DA and a dummy sub-pixel column along the second direction in the non-display area NDA. The second bank 374 is disposed between adjacent different color sub-pixels R, G and B along the first direction in the display area DA and is disposed between the sub-pixel R or B and the dummy sub-pixel DP adjacent along the first direction in the non-display area NDA. At this time, the opening 374a corresponding to the same color sub-pixel column of the second direction can extend into the dummy sub-pixel DP of the non-display area NDA adjacent thereto along the second direction.

The second bank 374 includes first, second, third and fourth portions 3741, 3742, 3743 and 3744. The first portion 3741 is disposed in the display area DA, the second and third portions 3742 and 3743 are disposed in the non-display area NDA, and the fourth portion 3744 is disposed in a boundary between the display area DA and the non-display area NDA adjacent along the first direction.

More particularly, the first portion 3741 is disposed between the adjacent sub-pixels R, G and B along the first direction, and the second portion 3742 is disposed to surround the outer edge of the non-display area NDA. The third portion 3743 is disposed between the adjacent dummy sub-pixels DP along the first direction, and the fourth portion 3744 is disposed between the sub-pixel R or B and the dummy sub-pixel DP adjacent along the first direction. Here, the third portion 3743 is disposed between the first portion 3741 and the second portion 3742 along the second direction and is connected to the first portion 3741 and the second portion 3742. In addition, the third portion 3743 is disposed between the second portion 3742 and the fourth portion 3744 along the second direction and is connected to the second portion 3742 and the fourth portion 3744.

The second portion 3742 of the second bank 374 completely overlaps the dummy electrode 364, and each of the third portion 3743 and the fourth portion 3744 of the second bank 374 partially overlaps.

A cross-sectional structure of the electroluminescent display device 3000 according to the third embodiment of the present disclosure will be described in detail with reference to FIG. 13.

Figure 13:
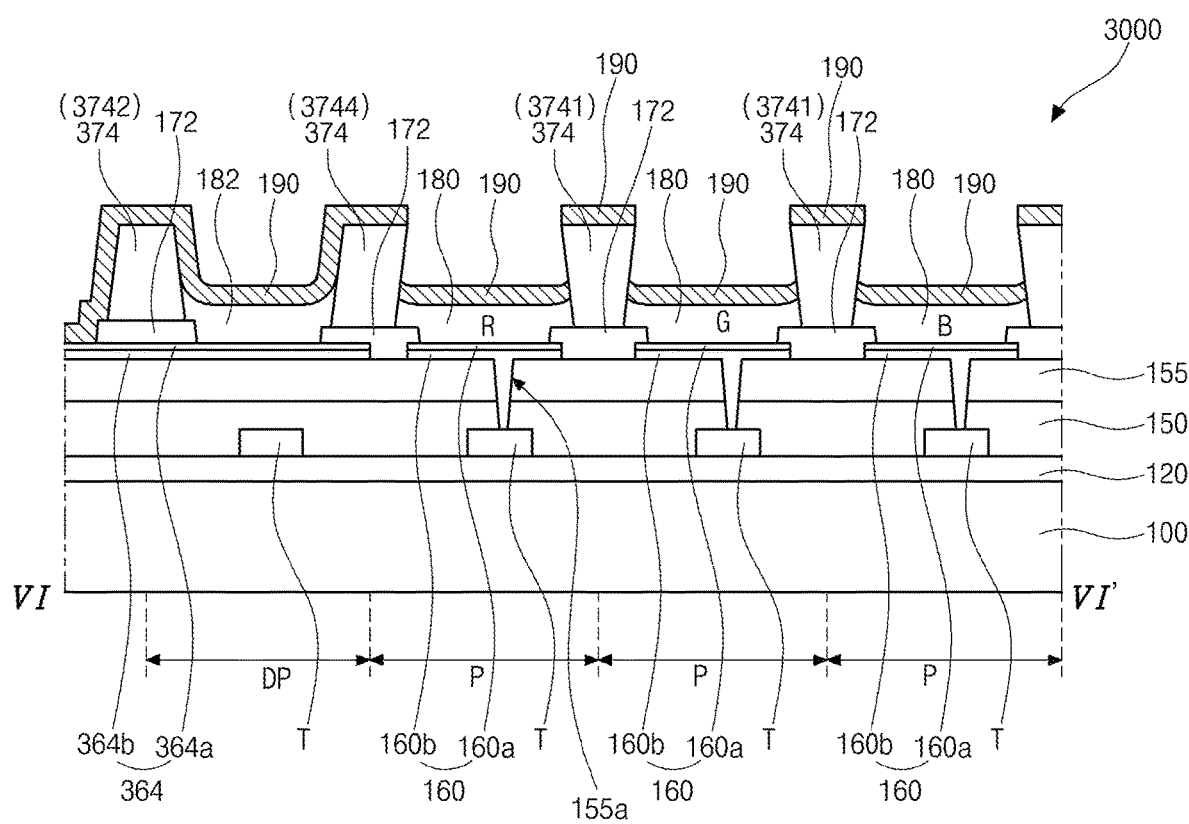
FIG. 13 is a cross-sectional view corresponding to the line VI-VI' of FIG. 12 according to an embodiment of the present disclosure.

FIG. 13 is a cross-sectional view corresponding to the line VI-VI' of FIG. 12 according to one embodiment of the present disclosure. The dummy sub-pixels DP arranged along the first direction in FIG. 12 have the same structure as those shown in FIG. 9 and FIG. 10, the dummy sub-pixel DP and the same color sub-pixels R, G and B sequentially arranged along the second direction in FIG. 12 have the same structures as that shown in FIG. 11, and illustration and description for these will be omitted.

As shown in FIG. 13, the plurality of pixel regions P respectively corresponding to the red, green and blue sub-pixels R, G and B and the dummy sub-pixel region DP corresponding to the dummy sub-pixel are defined on the substrate 100, and the buffer layer 120, the thin film transistors T, the passivation layer 150 and the overcoat layer 155 are sequentially formed on the substrate 100.

Here, each thin film transistor T can have the configuration shown in FIG. 2, but is not limited thereto. In addition, although not shown in the figure, the gate insulation layer and/or the interlayer insulation layer can be further formed between the buffer layer 120 and the passivation layer 150.

In each pixel region P, the overcoat layer 155 has the drain contact hole 155a exposing a part of the thin film transistor T, that is, the drain electrode together with the passivation layer 150.

The first electrode 160 is formed in each pixel region P on the overcoat layer 155, and the dummy electrode 364 is formed in the dummy sub-pixel region DP on the overcoat layer 155. The first electrode 160 contacts the drain electrode of the thin film transistor T through the drain contact hole 155a.

On the other hand, the passivation layer 150 and the overcoat layer 155 do not have a drain contact hole in the dummy sub-pixel region DP, and the dummy electrode 364 is not connected to the thin film transistor T in the dummy sub-pixel region DP.

Meanwhile, the thin film transistor T of the dummy sub-pixel region DP can be omitted.

Each of the first electrode 160 and the dummy electrode 364 includes the first layer 160a and 364a and the second layer 160b and 364b, and the second layer 160b and 364b is disposed between the first layer 160a and 364a and the substrate 100, more particularly, between the first layer 160a and 364a and the overcoat layer 155.

The first layer 160a and 364a is formed of a conductive material having relatively high work function, and the second layer 160b and 364b is formed of a metal material having relatively high reflectance. The second layer 160b and 364b serves as a reflective layer.

The first bank 172 of a hydrophilic property is formed on the first electrode 160 and the dummy electrode 364. The first bank 172 overlaps and covers edges of the first electrode 160 of the pixel region P. The first bank 172 is formed between adjacent same color sub-pixels R, G and B and between adjacent different color sub-pixels R, G and B.

Meanwhile, a part of the first bank 172 is formed on the dummy electrode 364 of the dummy sub-pixel region DP and overlaps the dummy electrode 364 of the dummy sub-pixel region DP. At this time, the both ends of the first bank 172 are disposed on the top surface of the dummy electrode 364. In addition, the first bank 172 can overlap and cover an edge of the dummy electrode 364 adjacent to the pixel region P.

The first bank 172 can be formed of a material having a hydrophilic property, for example, an inorganic insulating material such as silicon oxide (SiO$_2$) or silicon nitride (SiNx). Alternatively, the first bank 172 can be formed of polyimide.

The second bank 374 of a hydrophobic property is formed on the first bank 172. The second bank 374 has a thicker thickness than the first bank 172 and a narrower width than the first bank 172.

The second bank 374 has an opening 374a of FIG. 12 corresponding to a same color sub-pixel column and exposes the first electrodes 160 of the same color sub-pixel column and the first bank 172 between adjacent first electrodes 160 through the opening 374a of FIG. 12. In addition, the opening 374a of FIG. 12 extends into the dummy sub-pixel region DP adjacent to the same color sub-pixel column, and the dummy electrode 364 is exposed through the opening 374a of FIG. 12.

The second bank 374 includes the first, second, third, and fourth portions 3741, 3742, 3743 of FIG. 12, and 3744. The first portion 3741 is disposed between adjacent different sub-pixels R, G and B, and the second portion 3742 is disposed to correspond to the dummy sub-pixel DP. The third portion 3743 of FIG. 12 is disposed between the adjacent dummy sub-pixels DP along the first direction in FIG. 12, and the fourth portion 3744 is disposed between the sub-pixel R and the dummy sub-pixel DP adjacent to each other along the first direction in FIG. 12. Meanwhile, the third portion 3743 of FIG. 12 is disposed between first portion 3741 and the second portion 3742 along the second direction in FIG. 12 and is connected to the first portion 3741 and the second portion 3742. In addition, the third portion 3743 of FIG. 12 is disposed between the second portion 3742 and the fourth portion 3744 along the second direction in FIG. 12 and is connected to the second portion 3742 and the fourth portion 3744.

Here, the side surfaces of the first portion 3741 have a reverse slope, and the side surfaces of the second portion 3742 have a normal slope. That is, a top surface of the first portion 3741 has a wider width than a bottom surface of the first portion 3741, and a top surface of the second portion 3742 has a narrower width than a bottom surface of the second portion 3742.

Meanwhile, a side surface of the fourth portion 3744 adjacent to the first portion 3741 has a reverse slope, and another side surface of the fourth portion 3744 adjacent to the second portion 3742 has a normal slope. That is, in the third embodiment of the present disclosure, a first side surface of the fourth portion 3744 has the reverse slope, and a second side surface of the fourth portion 3744 has the normal slope.

In addition, a first part of a side surface of the third portion 3743 of FIG. 12 has a reverse slope and the second part of the side surface of the third portion 3743 of FIG. 12 has a normal slope. More particularly, the first part of the side surface of the third portion 3743 of FIG. 12 adjacent to the first portion 3741 has the reverse slope, and the second part of the side surface of the third portion 3743 of FIG. 12 adjacent to the second portion 3742 has the normal slope.

The side surfaces of the second portion 3742, the third portion 3743 and the fourth portion 3744 of FIG. 12 having the normal slope overlap the dummy electrode 364. That is, the side surfaces of the second portion 3742, the second part of the side surfaces of the third portion 3743 of FIG. 12, and the second side surface of the fourth portion 3744 are disposed right over the top surface of the dummy electrode 364.

The second bank 374 can be formed of an organic insulating material having a hydrophobic property. Alternatively, the second bank 374 can be formed of an organic insulating material having a hydrophilic property and can be subjected to a hydrophobic treatment.

The hydrophilic first bank 172 and the hydrophobic second bank 374 can be formed of the same material and formed as one body.

The light-emitting layer 180 is formed on the first electrode 160 exposed through the opening 374a of FIG. 12 of the second bank 374 in each pixel region P. Here, a red light-emitting layer is formed in the red sub-pixel R, a green light-emitting layer is formed in the green sub-pixel G, and a blue light-emitting layer is formed in the blue sub-pixel B.

The dummy light-emitting layer 182 is formed on the dummy electrode 364 in the dummy sub-pixel region DP. Referring to FIG. 12, the dummy light-emitting layer 182 of the dummy sub-pixel region DP is spaced apart from the light-emitting layer 180 of the pixel region P adjacent thereto along the first direction, and the dummy light-emitting layer 182 of the dummy sub-pixel region DP is connected to the light-emitting layer 180 of the pixel region P adjacent thereto along the second direction to thereby form one body.

The light-emitting layer 180 is formed through a solution process. Here, the solutions dropped into respective pixel regions P corresponding to the same color sub-pixel column, for example, the green sub-pixel column through different nozzles are connected to each other, and the light-emitting layer 180 is formed by drying the solutions. Accordingly, a deviation in the dropping amounts between the nozzles is minimized, and thicknesses of the light-emitting layers 180 can be uniform in the respective pixel regions P. At this time, the dummy light-emitting layer 182 is formed simultaneously with the light-emitting layer 180.

Heights of the light-emitting layer 180 and the dummy light-emitting layer 182 formed through the solution process rise around the second bank 374 as it gets closer to the second bank 374. Since the side surfaces of the first portion 3741 of the second bank 374 have the reverse slope and the side surfaces of the second portion 3742 of the second bank 374 have the normal slope, the heights of the light-emitting layer 180 at the side surfaces of the first portion 3741 are lower than the height of the dummy light-emitting layer 182 at the side surface of the second portion 3742. That is, in the present disclosure, the side surfaces of the second bank 374 corresponding to the pixel regions P are configured to have the reverse slope, and thus the pile-up phenomenon can be alleviated, thereby forming the light-emitting layers 180 with more uniform thicknesses.

Next, the second electrode 190 is formed on the light-emitting layer 180 and the second bank 374. At this time, the second electrode 190 on the light-emitting layer 180 is disconnected from the second electrode 190 on the first portion 3741 of the second bank 374 due to the side surface of the first portion 3741 of the second bank 374 having the reverse slope.

In addition, the second electrode 190 is formed on the dummy light-emitting layer 182. Since the side surface of the second portion 3742 of the second bank 374 has the normal slope, the second electrode 190 is also formed on the side surface of the second portion 3742, and the second electrode 190 on the dummy light-emitting layer 182 is connected to the second electrode 190 on the second portion 3742 of the second bank 374.

Further, since the first side surface of the fourth portion 3744 adjacent to the first portion 3741 has the reverse slope and the second side surface of the fourth portion 3744 adjacent to the second portion 3742 has the normal slope, the second electrode 190 is also formed on the second side surface of the fourth portion 3744. Accordingly, the second electrode 190 on the dummy light-emitting layer 182 is connected to the second electrode 190 on the fourth portion 3744.

As described above, in the electroluminescent display device 3000 according to the third embodiment of the present disclosure, the second electrode 190 is less disconnected in the non-display area NDA of FIG. 12 as compared with the first and second embodiments, and the resistance of the second electrode 190 can be further prevented from being increased.

In the present disclosure, by forming the light-emitting layer of each sub-pixel through the solution process, the fine metal mask can be omitted to thereby reduce the manufacturing costs, and a display device with a large size and high definition can be implemented.

In addition, the light-emitting layers of the same color sub-pixels are connected to each other and formed as one body, thereby reducing or minimizing the deviation in the dropping amount between nozzles and uniformly forming the thicknesses of the light-emitting layers of the sub-pixels. Therefore, the mura is prevented, thereby preventing the image quality of the display device from being lowered.

Moreover, the side surface of the bank in the display area is configured to have the reverse slope, and the pile-up phenomenon can be alleviated, thereby forming the light-emitting layers 180 with more uniform thicknesses. At least a part of the side surface of the bank in the non-display area is configured to have the normal slope, and the second electrode can be prevented from being disconnected, thereby preventing the increase of the resistance of the second electrode. Accordingly, the image quality of the display device can be improved.

It will be apparent to those skilled in the art that various modifications and variations can be made in a device of the present disclosure without departing from the sprit or scope of the embodiments. Thus, it is intended that the present disclosure covers the modifications and variations of this invention provided they come within the scope of the appended claims and their equivalents.

What is claimed is:

1. An electroluminescent display device comprising:
    a substrate on which a display area displaying an image and a non-display area surrounding the display area are defined;
    a plurality of sub-pixels disposed in the display area on the substrate and arranged along a first direction and a second direction;
    a plurality of dummy sub-pixels disposed in the non-display area on the substrate; and
    a bank disposed in the display area and the non-display area on the substrate,
    wherein the bank includes a first portion corresponding to the plurality of sub-pixels and a second portion corresponding to the plurality of dummy sub-pixels,
    wherein a first side surface of the first portion has a reverse slope and at least a part of a second side surface of the second portion has a normal slope, and
    wherein the first portion and the second portion are formed of a same material.

2. The electroluminescent display device of claim 1, wherein the second portion surrounds outer edges of the non-display area.

3. The electroluminescent display device of claim 2, wherein the bank further includes a third portion between adjacent dummy sub-pixels along the first direction, and
    wherein a first part of a third side surface of the third portion adjacent to the first portion has a reverse slope, and a second part of the third side surface of the third portion adjacent to the second portion has a normal slope.

4. The electroluminescent display device of claim 3, wherein the bank further includes a fourth portion between the sub-pixel and the dummy sub-pixel adjacent to each other along the first direction, and
    wherein a fourth side surface of the fourth portion adjacent to the first portion has a reverse slope, and a fifth side surface of the fourth portion adjacent to the second portion has a normal slope.

5. The electroluminescent display device of claim 1, wherein the bank has an opening corresponding to a sub-pixel column that includes sub-pixels arranged along the second direction.

6. The electroluminescent display device of claim 5, wherein at least a part of the bank has a hydrophobic property.

7. The electroluminescent display device of claim 6, further comprising a hydrophilic bank between adjacent sub-pixels along the second direction.

8. The electroluminescent display device of claim 1, wherein a light-emitting diode including a first electrode, a light-emitting layer, and a second electrode is provided at each of the plurality of sub-pixels.

9. The electroluminescent display device of claim 8, wherein the light-emitting layers of the sub-pixels arranged along the second direction are connected to each other to form one body.

10. The electroluminescent display device of claim 8, further comprising at least one thin film transistor between the substrate and the first electrode, and the first electrode is connected to the at least one thin film transistor.

11. The electroluminescent display device of claim 8, wherein a dummy electrode, a dummy light-emitting layer, and at least a portion of the second electrode are provided at each of the dummy sub-pixels.

12. The electroluminescent display device of claim 11, wherein the second electrode is formed on the second side surface and a top surface of the second portion of the bank.

13. The electroluminescent display device of claim 11, wherein the light-emitting layer of the sub-pixel and the dummy light-emitting layer of the dummy sub-pixel adjacent to each other along the second direction are formed as one body.

14. The electroluminescent display device of claim 11, wherein the dummy electrode overlaps a side surface of the bank having a normal slope.

15. The electroluminescent display device of claim 14, wherein the dummy electrode includes a reflective layer.

16. The electroluminescent display device of claim 1, wherein the first portion and the second portion have a same thickness.

17. The electroluminescent display device of claim 8, wherein the light-emitting layer is in contact with the first side surface having the reverse slope.

18. The electroluminescent display device of claim 8, further comprising a connection pattern in at least one sub-pixel and formed of a same material as the first electrode, wherein the connection pattern is spaced apart from the first side surface having the reverse slope.

* * * * *